(12) United States Patent
Saito et al.

(10) Patent No.: US 9,627,248 B2
(45) Date of Patent: Apr. 18, 2017

(54) INSULATED GATE TYPE SEMICONDUCTOR DEVICE

(71) Applicant: TOYOTA JIDOSHA KABUSHIKI KAISHA, Toyota-shi, Aichi-ken (JP)

(72) Inventors: Jun Saito, Nagoya (JP); Kimimori Hamada, Toyota (JP); Akitaka Soeno, Toyota (JP); Hidefumi Takaya, Toyota (JP); Sachiko Aoi, Nagakute (JP); Toshimasa Yamamoto, Ichinomiya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/110,802

(22) PCT Filed: Feb. 5, 2015

(86) PCT No.: PCT/JP2015/000522
§ 371 (c)(1),
(2) Date: Jul. 11, 2016

(87) PCT Pub. No.: WO2015/145939
PCT Pub. Date: Oct. 1, 2015

(65) Prior Publication Data
US 2017/0011952 A1    Jan. 12, 2017

(30) Foreign Application Priority Data

Mar. 25, 2014    (JP) .................. 2014-062009

(51) Int. Cl.
*H01L 29/66* (2006.01)
*H01L 21/762* (2006.01)
(Continued)

(52) U.S. Cl.
CPC ...... *H01L 21/76229* (2013.01); *H01L 21/761* (2013.01); *H01L 29/0619* (2013.01);
(Continued)

(58) Field of Classification Search
CPC ............ H01L 21/76229; H01L 21/761; H01L 29/0619; H01L 29/0696; H01L 29/4236; H01L 29/1608
(Continued)

(56) References Cited

FOREIGN PATENT DOCUMENTS

JP    2008-135522 A    6/2008

*Primary Examiner* — Elias M Ullah
(74) *Attorney, Agent, or Firm* — Oliff PLC

(57) ABSTRACT

An insulating gate type semiconductor device being capable of easily depleting an outer periphery region is provided. The insulating gate type semiconductor device includes: first to fourth outer periphery trenches formed in a front surface of a semiconductor substrate; insulating layers located in the outer periphery trenches; fifth semiconductor regions being of a second conductive type and formed in ranges exposed to bottom surfaces of the outer periphery trenches; and a connection region connecting the fifth semiconductor region exposed to the bottom surface of the second outer periphery trench to the fifth semiconductor region exposed to the bottom surface of the third outer periphery trench. A clearance between the second and third outer periphery trenches is wider than each of a clearance between the first and second outer periphery trenches and a clearance between the third and fourth outer periphery trenches.

4 Claims, 19 Drawing Sheets

(51) Int. Cl.
    *H01L 29/06*     (2006.01)
    *H01L 29/16*     (2006.01)
    *H01L 29/423*    (2006.01)
    *H01L 21/761*    (2006.01)

(52) U.S. Cl.
    CPC ...... *H01L 29/0696* (2013.01); *H01L 29/1608* (2013.01); *H01L 29/4236* (2013.01)

(58) Field of Classification Search
    USPC .......................................................... 257/331
    See application file for complete search history.

INSULATED GATE TYPE SEMICONDUCTOR DEVICE

TECHNICAL FIELD

This application is based upon and claims the benefit of priority of the prior Japanese Patent application No. 2014-062009, filed on Mar. 25, 2014, the entire contents of which are incorporated herein by reference.

The technique disclosed herein relates to an insulated gate type semiconductor device.

BACKGROUND ART

Japanese Patent Application Publication No. 2008-135522 (hereinafter, referred to as Patent Literature 1) discloses an insulated gate type semiconductor device having a device region in which a MOS structure is formed and an outer periphery region around the device region. In the device region, a plurality of gate trenches are formed, and in each gate trench, a gate insulating film and a gate electrode are formed. In a range exposed to a bottom surface of the gate trench, a p-type bottom surface surrounding region (hereinafter, referred to as a device portion bottom surface surrounding region) is formed. In the outer periphery region, a plurality of trenches is formed so as to surround the device region, and an insulating layer fills each trench. In a range exposed to a bottom surface of each trench in the outer periphery region, a p-type bottom surface surrounding region (hereinafter, referred to as an outer periphery bottom surface surrounding region) is formed. When a MOSFET turns off, in the device region, a depletion layer expands from the device portion bottom surface surrounding region into a drift region. Thus, depletion of the drift region in the device region is promoted. In addition, in the outer periphery region, a depletion layer expands from the outer periphery bottom surface surrounding region into the drift region. Thus, depletion of the drift region in the outer periphery region is promoted. Therefore, the withstand voltage of the insulated gate type semiconductor device is improved.

SUMMARY OF INVENTION

In the insulated gate type semiconductor device of Patent Literature 1, in the device region, depletion layers substantially simultaneously expand from the respective device portion bottom surface surrounding regions. In each drift region present between two device portion bottom surface surrounding regions, depletion progresses from both sides, and therefore the drift region is easily depleted. On the other hand, in the outer periphery region, when a depletion layer expanding from the device region has reached the primary outer periphery bottom surface surrounding region (the outer periphery bottom surface surrounding region that is closest to the device region) in the outer periphery region, a depletion layer extends from the primary outer periphery bottom surface surrounding region to the secondary outer periphery bottom surface surrounding region (the second of the outer periphery bottom surface surrounding regions from the device region). When the depletion layer has reached the secondary outer periphery bottom surface surrounding region, a depletion layer extends from the secondary outer periphery bottom surface surrounding region to the tertiary outer periphery bottom surface surrounding region. Thus, a depletion layer sequentially expands via each outer periphery bottom surface surrounding region. Therefore, in each drift region present between two outer periphery bottom surface surrounding regions, depletion progresses only from one side. Therefore, in order to sufficiently deplete the outer periphery region, it is necessary to narrow the clearance between the trenches in the outer periphery region, thereby narrowing the clearance between the outer periphery bottom surface surrounding regions.

Narrowing the clearance between the trenches in the outer periphery region thins a partition wall that separates the trenches. Stress such as thermal stress is applied to the partition wall during a producing process. If the partition wall is thin, the partition wall may be deformed by the stress, whereby damage such as crack is likely to occur in the partition wall. Therefore, in order to suppress such damage in the partition wall, an insulated gate type semiconductor device disclosed herein has the following configuration.

An insulated gate type semiconductor device disclosed herein comprises: a semiconductor substrate; a front surface electrode formed on a front surface of the semiconductor substrate; and a rear surface electrode formed on a rear surface of the semiconductor substrate. The insulated gate type semiconductor device is configured to switch current between the front surface electrode and the rear surface electrode. The insulated gate type semiconductor device further comprises: a first semiconductor region being of a first conductive type and connected to the front surface electrode; a second semiconductor region being of a second conductive type and in contact with the first semiconductor region; a third semiconductor region being of the first conductive type and separated from the first semiconductor region by the second semiconductor region; a plurality of gate trenches formed in the front surface of the semiconductor substrate and penetrating the second semiconductor region to reach the third semiconductor region; gate insulating films and gate electrodes located in the gate trenches; fourth semiconductor regions being of the second conductive type and formed in ranges exposed to bottom surfaces of the gate trenches; a plurality of outer periphery trenches formed in the front surface of the semiconductor substrate in a range outside the second semiconductor region. The plurality of outer periphery trenches includes: a first outer periphery trench, a second outer periphery trench adjacent to the first outer periphery trench on the second semiconductor region side, a third outer periphery trench located on the second semiconductor region side with respect to the second outer periphery trench, and a fourth outer periphery trench adjacent to the third outer periphery trench on the second semiconductor region side. The insulated gate type semiconductor device further comprises: insulating layers located in the outer periphery trenches; fifth semiconductor regions being of the second conductive type and formed in ranges exposed to bottom surfaces of the outer periphery trenches; and a connection region made of a conductive layer or a second conductive type semiconductor region and connecting the fifth semiconductor region exposed to the bottom surface of the second outer periphery trench to the fifth semiconductor region exposed to the bottom surface of the third outer periphery trench. A clearance between the second outer periphery trench and the third outer periphery trench is wider than each of a clearance between the first outer periphery trench and the second outer periphery trench and a clearance between the third outer periphery trench and the fourth outer periphery trench.

In this insulated gate type semiconductor device, the width of a partition wall between the second outer periphery trench and the third outer periphery trench (hereinafter, referred to as a second partition wall) is great, and the width of a partition wall between the first outer periphery trench and the second outer periphery trench (hereinafter, referred to as a first partition wall), and the width of a partition wall between the third outer periphery trench and the fourth outer periphery trench (hereinafter, referred to as a third partition wall) are narrow. That is, the first partition wall and the third partition wall having the narrow widths are located adjacent to the second partition wall having the great width. In a producing process for the insulated gate type semiconductor device, when stress is applied to each partition wall, since the second partition wall having the great width is unlikely to deform, deformation of the first partition wall and the third partition wall located adjacent to the second partition wall is also suppressed. Therefore, damage in the first partition wall and the third partition wall is suppressed. In addition, since the width of the third partition wall is narrow, when the insulated gate type semiconductor device is turned off, a depletion layer can reach the fifth semiconductor region at the bottom surface of the third outer periphery trench from the fifth semiconductor region at the bottom surface of the fourth outer periphery trench. The fifth semiconductor region at the bottom surface of the third outer periphery trench and the fifth semiconductor region at the bottom surface of the second outer periphery trench are connected by the connection region made of the conductive layer or the second conductive type semiconductor region. Therefore, when a depletion layer has reached the fifth semiconductor region at the bottom surface of the third outer periphery trench, the depletion layer extends from the fifth semiconductor region at the bottom surface of the second outer periphery trench. Since the width of the first partition wall is narrow, the depletion layer extending from the fifth semiconductor region at the bottom surface of the second outer periphery trench reaches the fifth semiconductor region at the bottom surface of the first outer periphery trench. Thus, the insulated gate type semiconductor device can extend the depletion layer from the fourth outer periphery trench to the first outer periphery trench. Therefore, the insulated gate type semiconductor device has high withstand voltage.

BRIEF DESCRIPTION OF DRAWINGS

FIG. 1 is an enlarged view of a range II in FIG. 1.

DESCRIPTION OF EMBODIMENTS

First, aspects of embodiments described below will be recited. It is noted that any of the following aspects exerts utility independently.

(Feature 1) An insulated gate type semiconductor device comprises: a first intervening trench and an insulating layer. The first intervening trench is formed between the second outer periphery trench and the third outer periphery trench and extends from the second outer periphery trench side to the third outer periphery trench side. The insulating layer is located in the first intervening trench. The connection region is made of a sixth semiconductor region formed in a range exposed to a bottom surface of the first intervening trench, connected to the fifth semiconductor region exposed to the bottom surface of the second outer periphery trench, and connected to the fifth semiconductor region exposed to the bottom surface of the third outer periphery trench.

(Feature 2) The first intervening trench is connected to the second outer periphery trench and is connected to the third outer periphery trench.

(Feature 3) The plurality of outer periphery trenches comprises the fifth outer periphery trench located on the second semiconductor region side with respect to the fourth outer periphery trench. A clearance between the fourth outer periphery trench and the fifth outer periphery trench is wider than each of the clearance between the first outer periphery trench and the second outer periphery trench and the clearance between the third outer periphery trench and the fourth outer periphery trench. The insulated gate type semiconductor device comprises: a second intervening trench, an insulating layer, and a seventh semiconductor region. The second intervening trench is formed between the fourth outer periphery trench and the fifth outer periphery trench, extends from the fourth outer periphery trench side to the fifth outer periphery trench side, is connected to the fourth outer periphery trench, and is connected to the fifth outer periphery trench The insulating layer is located in the second intervening trench. The seventh semiconductor region is of the second conductive type, formed in a range exposed to a bottom surface of the second intervening trench, connected to the fifth semiconductor region exposed to the bottom surface of the fourth outer periphery trench, and connected to the fifth semiconductor region exposed to the bottom surface of the fifth outer periphery trench. The second intervening trench is configured to extend on an extended line of the first intervening trench.

First Embodiment

Figure 1:
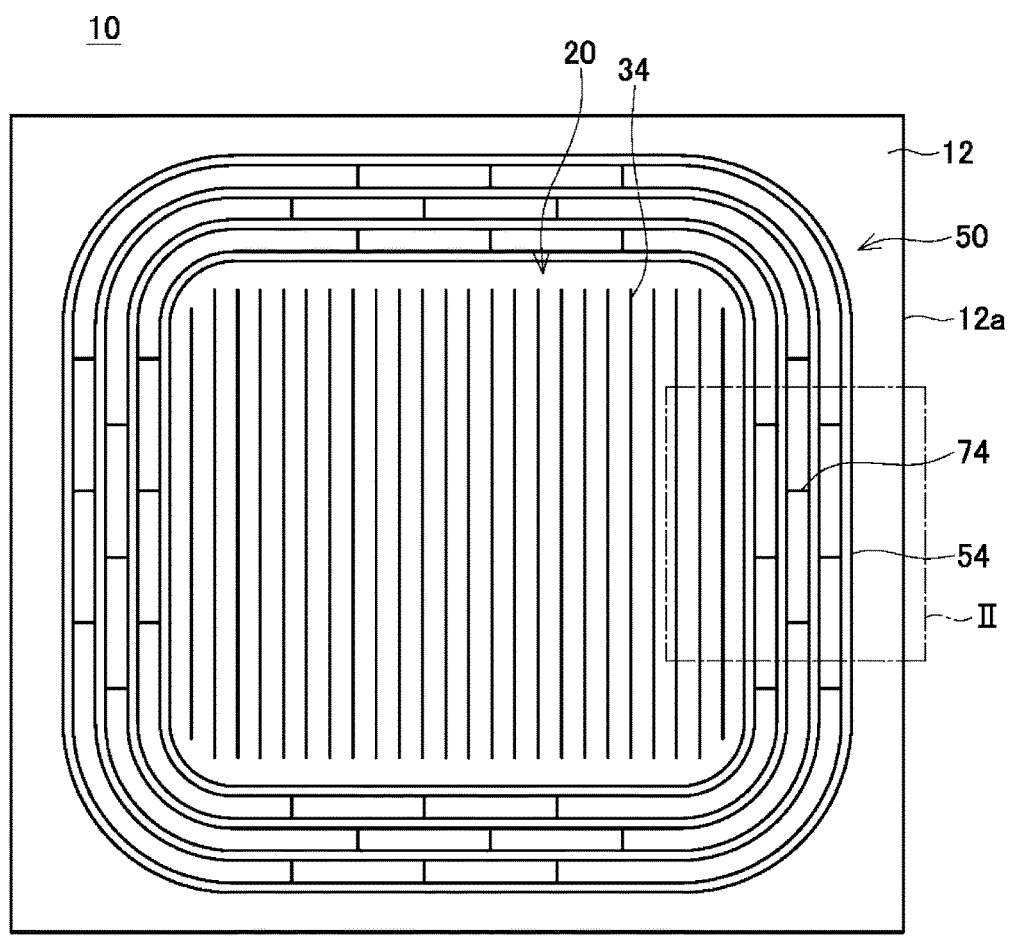
FIG. 1 is a plan view of a semiconductor device 10.
Figure 2:
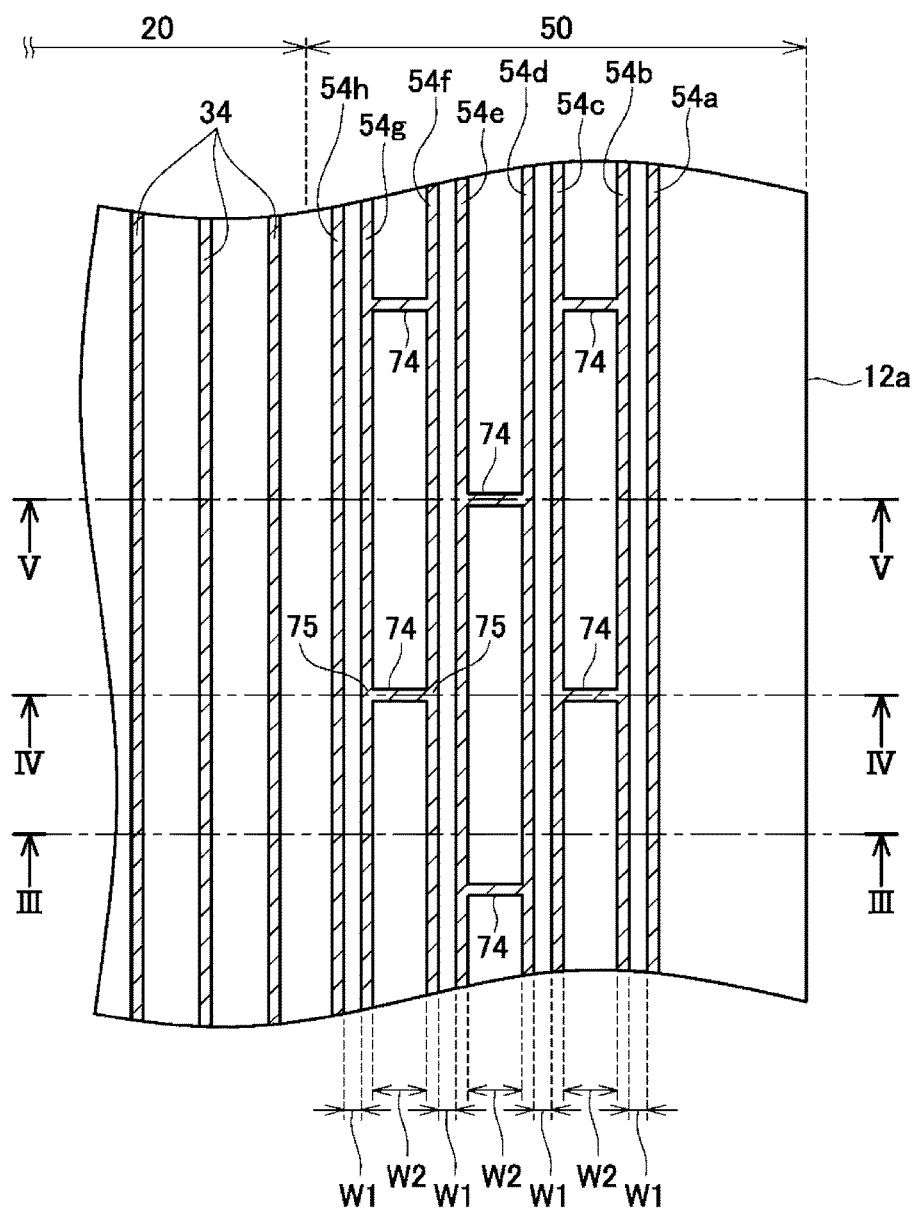

The semiconductor device 10 shown in FIGS. 1 and 2 has a semiconductor substrate 12 made of SiC. In FIGS. 1 and 2, an electrode, an insulating film, and the like on the semiconductor substrate 12 are not shown. The semiconductor substrate 12 has a cell region 20 and an outer periphery region 50. In the cell region 20, a MOSFET is formed. The outer periphery region 50 is a region between the cell region 20 and an end surface 12a of the semiconductor substrate 12.

Figure 3:
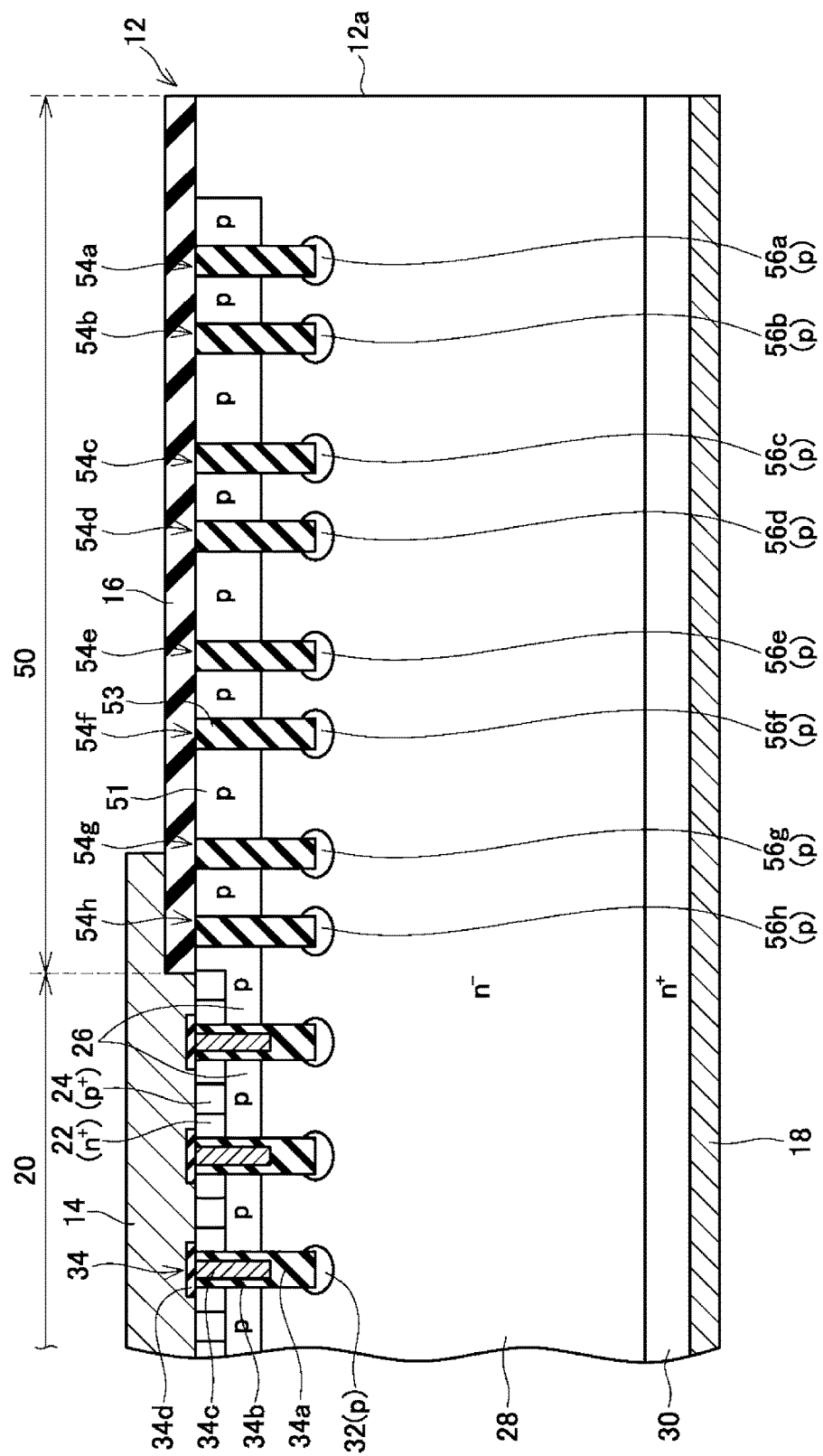
FIG. 3 is a vertical sectional view along III-III line in FIG. 2.

As shown in FIG. 3, on a front surface of the semiconductor substrate 12, a front surface electrode 14 and an insulating layer 16 are formed. The insulating layer 16 covers the front surface of the semiconductor substrate 12 in the outer periphery region 50. The front surface electrode 14 is in contact with the semiconductor substrate 12 in the cell region 20. In other words, a region in which the front surface electrode 14 is in contact with the semiconductor substrate 12 is the cell region 20, and a region on an outer periphery side (end surface 12a side) with respect to the contact region is the outer periphery region 50. On a rear surface of the semiconductor substrate 12, a rear surface electrode 18 is formed. The rear surface electrode 18 covers substantially an entirety of the rear surface of the semiconductor substrate 12.

In the cell region 20, source regions 22, body contact regions 24, a body region 26, a drift region 28, a drain region 30, and p-type floating regions 32 are formed.

The source regions 22 are n-type regions containing n-type impurities at a high concentration. The source regions 22 are formed in ranges exposed to a top surface of the semiconductor substrate 12. The source regions 22 are ohmically-connected to the front surface electrode 14.

The body contact regions 24 are p-type regions containing p-type impurities at a high concentration. The body contact regions 24 are formed so as to be exposed to the top surface of the semiconductor substrate 12 at a position where the source regions 22 are not formed. The body contact regions 24 are ohmic-connected to the front surface electrode 14.

The body region 26 is a p-type region containing p-type impurities at a low concentration. The p-type impurity concentration in the body region 26 is lower than the p-type impurity concentration in the body contact regions 24. The body region 26 is formed under the source regions 22 and the body contact regions 24, and is in contact with these regions.

The drift region 28 is an n-type region containing n-type impurities at a low concentration. The n-type impurity concentration in the drift region 28 is lower than the n-type impurity concentration in the source regions 22. The drift region 28 is formed under the body region 26. The drift region 28 is in contact with the body region 26, and is separated from the source regions 22 by the body region 26.

The drain region 30 is an n-type region containing n-type impurities at a high concentration. The n-type impurity concentration in the drain region 30 is higher than the n-type impurity concentration in the drift region 28. The drain region 30 is formed under the drift region 28. The drain region 30 is in contact with the drift region 28, and is separated from the body region 26 by the drift region 28. The drain region 30 is formed in a range exposed to a bottom surface of the semiconductor substrate 12. The drain region 30 is ohmic-connected to the rear surface electrode 18.

As shown in FIGS. 1 to 3, in the top surface of the semiconductor substrate 12 in the cell region 20, a plurality of gate trenches 34 is formed. As shown in FIG. 1, the gate trenches 34 extend in straight lines in parallel with each other on the front surface of the semiconductor substrate 12. As shown in FIG. 3, each gate trench 34 penetrates the source region 22 and the body region 26, to reach the drift region 28. In each gate trench 34, a bottom insulating layer 34a, a gate insulating film 34b, and a gate electrode 34c are formed. The bottom insulating layer 34a is a thick insulating layer formed at a bottom of the gate trench 34. A side surface of the gate trench 34 above the bottom insulating layer 34a is covered by the gate insulating film 34b. In the gate trench 34 above the bottom insulating layer 34a, the gate electrode 34c is formed. The gate electrode 34c faces the corresponding source region 22, the body region 26, and the drift region 28 via the gate insulating film 34b. The gate electrode 34c is insulated from the semiconductor substrate 12 by the gate insulating film 34b and the bottom insulating layer 34a. A top surface of the gate electrode 34c is covered by an insulating layer 34d. The gate electrode 34c is insulated from the front surface electrode 14 by the insulating layer 34d.

Each of the p-type floating region 32 is formed, inside the semiconductor substrate 12, in a range exposed to a bottom surface of each gate trench 34 (that is, a range in contact with the bottom surface). Each p-type floating region 32 is surrounded by the drift region 28. The p-type floating regions 32 are separated from each other by the drift region 28. Also, each p-type floating region 32 is separated from the body region 26 by the drift region 28.

In a range exposed to the front surface of the semiconductor substrate 12 in the outer periphery region 50, a p-type front surface region 51 is formed. The front surface region 51 expands to substantially the same depth as the body region 26. The drift region 28 and the drain region 30 described above expand into the outer periphery region 50. The drift region 28 and the drain region 30 expand to the end surface 12a of the semiconductor substrate 12. The drift region 28 has contact with the front surface region 51 from a lower side.

In the top surface of the semiconductor substrate 12 in the outer periphery region 50, a plurality of outer periphery trenches 54 (that is, 54a to 54h) are formed. Each outer periphery trench 54 penetrates the front surface region 51, to reach the drift region 28. In each outer periphery trench 54, an insulating layer 53 is formed. As shown in FIG. 1, each outer periphery trench 54 is formed in an annular shape circulating around the cell region 20, when the semiconductor substrate 12 is viewed from above. The outer periphery trenches 54 are distanced from each other. As shown in FIG. 3, the front surface region 51 is separated from the body region 26 (that is, the p-type region in contact with the source region 22) by the outer periphery trench 54h on the innermost circumference side. In addition, the front surface regions 51 are separated from each other by the outer periphery trenches 54. In other words, the p-type region inside the outer periphery trench 54h on the innermost circumference side is the body region 26, and the p-type region outside the outer periphery trench 54h is the front surface region 51. Therefore, the outer periphery trenches 54a to 54h are formed outside the body region 26.

As shown in FIG. 2, clearances W1 are provided between the outer periphery trench 54a and the outer periphery trench 54b, between the outer periphery trench 54c and the outer periphery trench 54d, between the outer periphery trench 54e and the outer periphery trench 54f, and between the outer periphery trench 54g and the outer periphery trench 54h. In addition, clearances W2 are provided between the outer periphery trench 54b and the outer periphery trench 54c, between the outer periphery trench 54d and the outer periphery trench 54e, and between the outer periphery trench 54f and the outer periphery trench 54g. The clearance W2 is wider than the clearance W1. Hereinafter, a semiconductor layer between two outer periphery trenches 54 may be referred to as a partition wall. That is, the clearances W1 and W2 correspond to the widths of the partition walls.

Inside the semiconductor substrate 12, in a range exposed to a bottom surface of each outer periphery trench 54 (that is, a range in contact with the bottom surface), a p-type bottom surface region 56 is formed. The bottom surface regions 56 are formed along the outer periphery trenches 54 so as to cover the entire bottom surfaces of the outer periphery trenches 54. Each bottom surface region 56 is surrounded by the drift region 28. The bottom surface regions 56 are separated from each other by the drift region 28. In addition, each bottom surface region 56 is separated from the front surface region 51 and the body region 26 by the drift region 28. Hereinafter, the bottom surface regions 56 under the outer periphery trenches 54a to 54g are referred to as bottom surface regions 56a to 56g, respectively.

Figure 4:
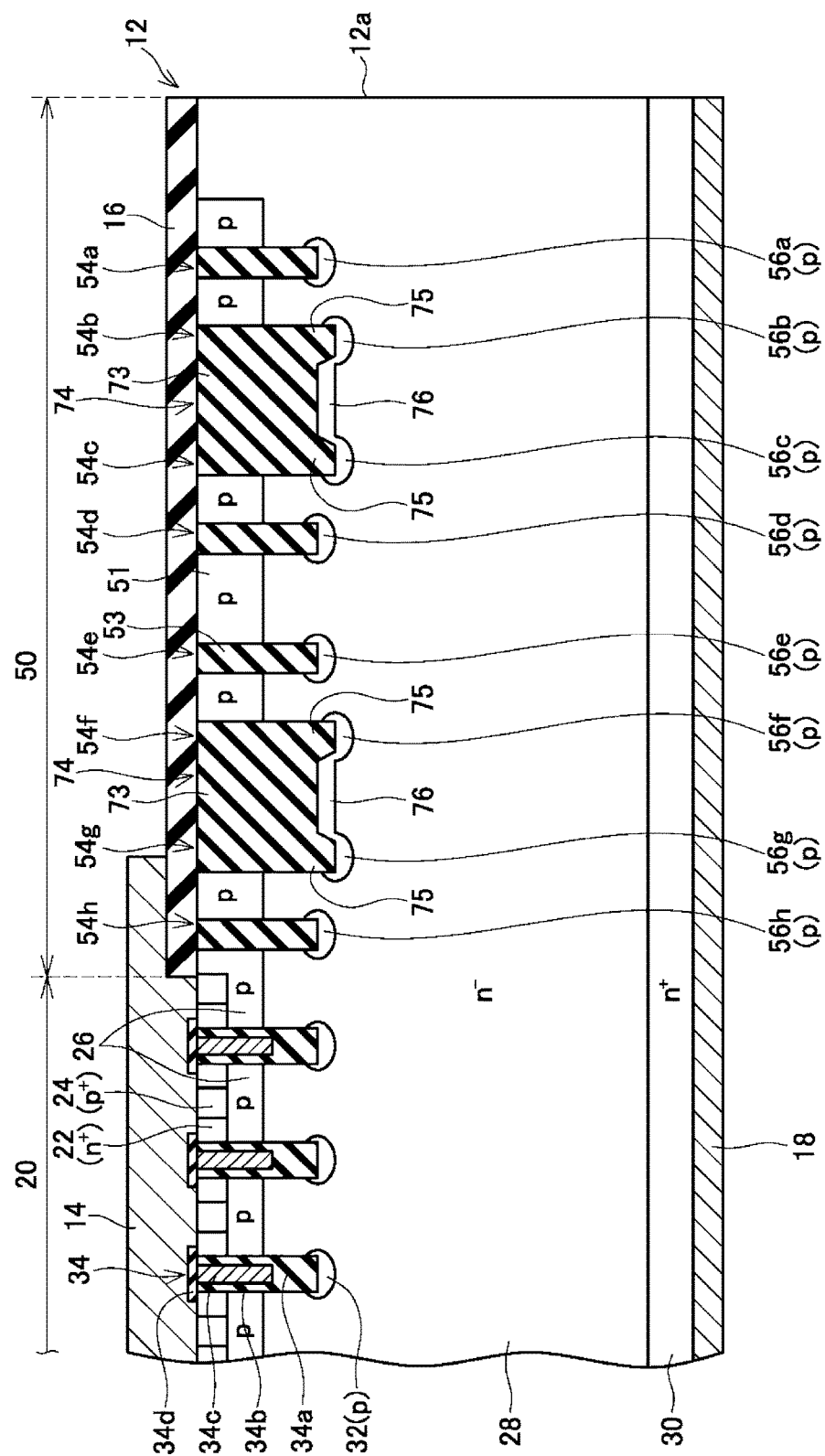
FIG. 4 is a vertical sectional view along IV-IV line in FIG. 2.
Figure 5:
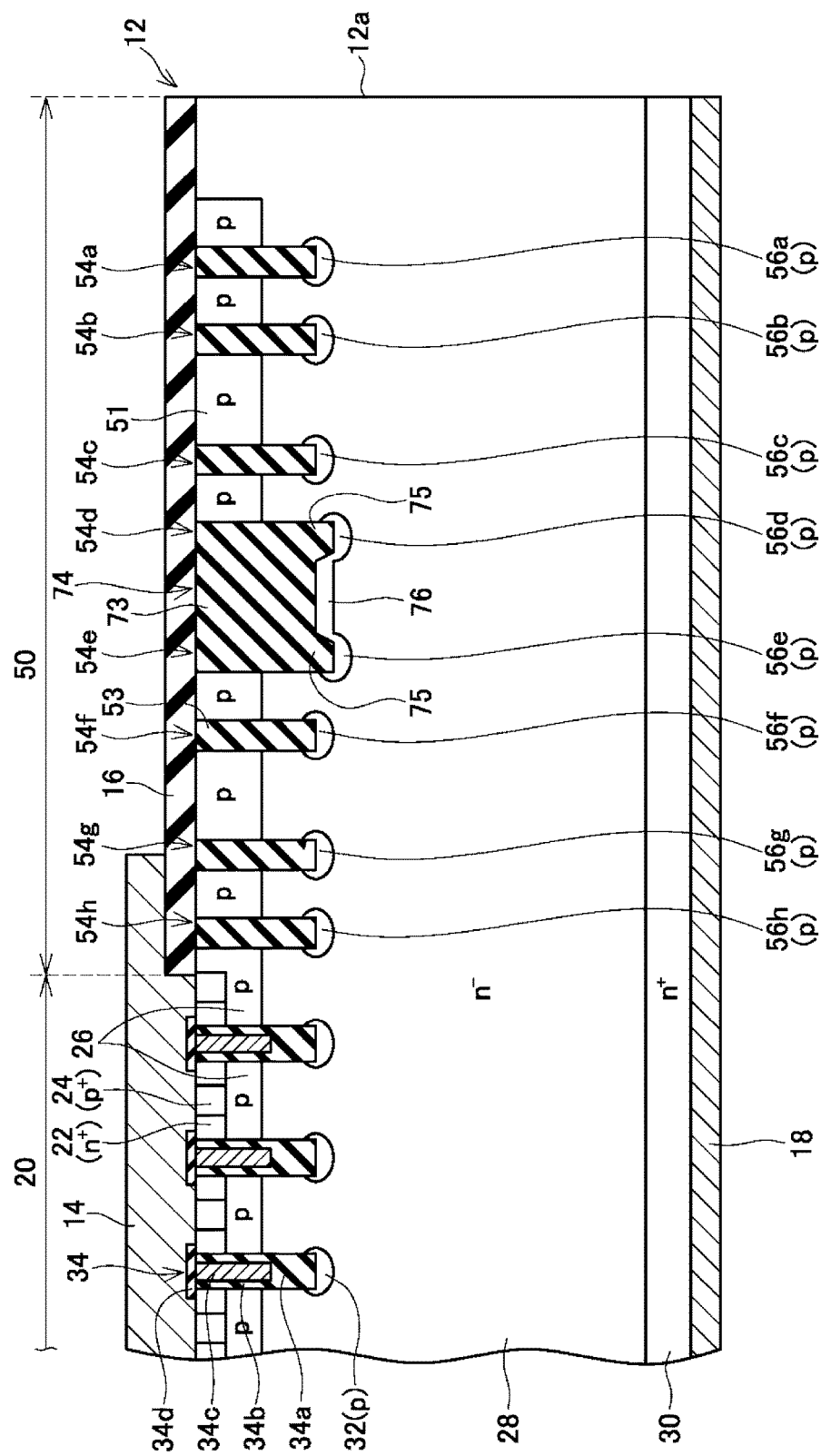
FIG. 5 is a vertical sectional view along V-V line in FIG. 2.

As shown in FIGS. 2, 4, and 5, in the top surface of the semiconductor substrate 12 in the outer periphery region 50, a plurality of intervening trenches 74 is formed. The intervening trenches 74 are formed between the outer periphery trench 54b and the outer periphery trench 54c, between the outer periphery trench 54d and the outer periphery trench 54e, and between the outer periphery trench 54f and the outer periphery trench 54g. That is, the intervening trenches 74 are formed in the partition walls having the width W2. The intervening trenches 74 extend along a direction perpendicular to the outer periphery trenches 54. Both ends of each intervening trench 74 are connected to the outer periphery trenches 54. That is, each intervening trench 74 connects the outer periphery trenches 54 located on both sides of the partition wall having the width W2. As shown in FIGS. 4 and 5, each intervening trench 74 penetrates the front surface region 51, to reach the drift region 28. The intervening trenches 74 have substantially the same depth as the outer periphery trenches 54. However, at an intersection 75 of each outer periphery trench 54 and each intervening trench 74, the trench is slightly deeper than at the other positions.

In each intervening trench 74, an insulating layer 73 is formed. The insulating layers 73 in the intervening trenches 74 are connected to the insulating layers 53 in the outer periphery trenches 54.

Inside the semiconductor substrate 12, in a range exposed to a bottom surface of each intervening trench 74 (that is, a range in contact with the bottom surface), a p-type bottom surface region 76 is formed. The bottom surface regions 76 are formed along the intervening trenches 74 so as to cover the entire bottom surfaces of the intervening trenches 74. The bottom surface regions 76 at the bottom surfaces of the intervening trenches 74 are connected to the bottom surface regions 56 at the bottom surfaces of the outer periphery trenches 54. That is, each bottom surface region 76 connects the bottom surface regions 56 located on both sides of the partition wall having the width W2. The bottom surface regions 76 are formed at substantially the same depth as the bottom surface regions 56. However, at an intersection 75, the bottom surface region 76 (that is, the bottom surface region 56) is slightly shifted downward relative to the bottom surface regions 56 and 76 at the other positions.

Next, operation of the semiconductor device 10 will be described. To operate the semiconductor device 10, voltage is applied between the rear surface electrode 18 and the front surface electrode 14 such that the rear surface electrode 18 becomes plus. Further, gate ON voltage is applied to the gate electrodes 34c, whereby the MOSFET in the cell region 20 is turned on. That is, a channel is formed in the body region 26 at a position facing each gate electrode 34c, and electrons flow from the front surface electrode 14 through the source region 22, the channel, the drift region 28, and the drain region 30 to the rear surface electrode 18.

When application of the gate ON voltage to each gate electrode 34c is stopped, the channel disappears and the MOSFET is turned off. When the MOSFET is turned off, a depletion layer expands from a pn junction at the boundary between the body region 26 and the drift region 28, into the drift region 28. When the depletion layer has reached the p-type floating regions 32 in the cell region 20, depletion layers expand also from the p-type floating regions 32, into the drift region 28. Therefore, the drift region 28 positioned between two p-type floating regions 32 is depleted by the depletion layers expanding from the p-type floating regions 32 on both sides. Thus, depletion layers extend in the cell region 20, whereby high withstand voltage in the cell region 20 is realized.

The above-described depletion layer extending from the pn junction reaches the bottom surface region 56h under the outer periphery trench 54h positioned closest to the cell region 20. Then, a depletion layer expands from the bottom surface region 56h into the drift region 28 therearound. Since the clearance W1 between the outer periphery trench 54h and the outer periphery trench 54g is narrow, the depletion layer extending from the bottom surface region 56h reaches the bottom surface region 56g. As shown in FIG. 4, the bottom surface region 56g is connected to the bottom surface region 56f by the bottom surface region 76 under the intervening trench 74. Therefore, when the depletion layer has reached the bottom surface region 56g, a depletion layer expands from the entirety of the bottom surface regions 56g and 56f into the drift region 28 therearound. Since the clearance W1 between the outer periphery trench 54f and the outer periphery trench 54e is narrow, the depletion layer extending from the bottom surface region 56f reaches the bottom surface region 56e. As shown in FIG. 5, the bottom surface region 56e is connected to the bottom surface region 56d by the bottom surface region 76. Therefore, when the depletion layer has reached the bottom surface region 56e, a depletion layer expands from the entirety of the bottom surface regions 56e and 56d into the drift region 28 therearound. Since the clearance W1 between the outer periphery trench 54d and the outer periphery trench 54c is narrow, the depletion layer extending from the bottom surface region 56d reaches the bottom surface region 56c. As shown in FIG. 4, the bottom surface region 56c is connected to the bottom surface region 56b by the bottom surface region 76. Therefore, when the depletion layer has reached the bottom surface region 56c, a depletion layer expands from the entirety of the bottom surface regions 56c and 56b into the drift region 28 therearound. Since the clearance W1 between the outer periphery trench 54b and the outer periphery trench 54a is narrow, the depletion layer extending from the bottom surface region 56b reaches the bottom surface region 56a. Therefore, a depletion layer expands from the bottom surface region 56a into the drift region 28 therearound. In this way, the depletion layer extends from the bottom surface region 56h on the innermost circumference side to the bottom surface region 56a on the outermost circumference side. Thus, the depletion layer broadly extends in the drift region 28 in the outer periphery region 50. The bottom surface regions 56 on both sides of each partition wall having the width W1 are separated from each other by the drift region 28. Therefore, a potential difference occurs between these bottom surface regions 56. Therefore, in the outer periphery region 50, the potential is distributed such that the potential gradually changes from the inner circumference side to the outer circumference side. Thus, since the depletion layer extends in the outer periphery region 50 and the potential distribution that gradually changes is formed in the outer periphery region, electric field concentration in the outer periphery region 50 is suppressed. Therefore, withstand voltage of the semiconductor device 10 is high.

Figure 6:
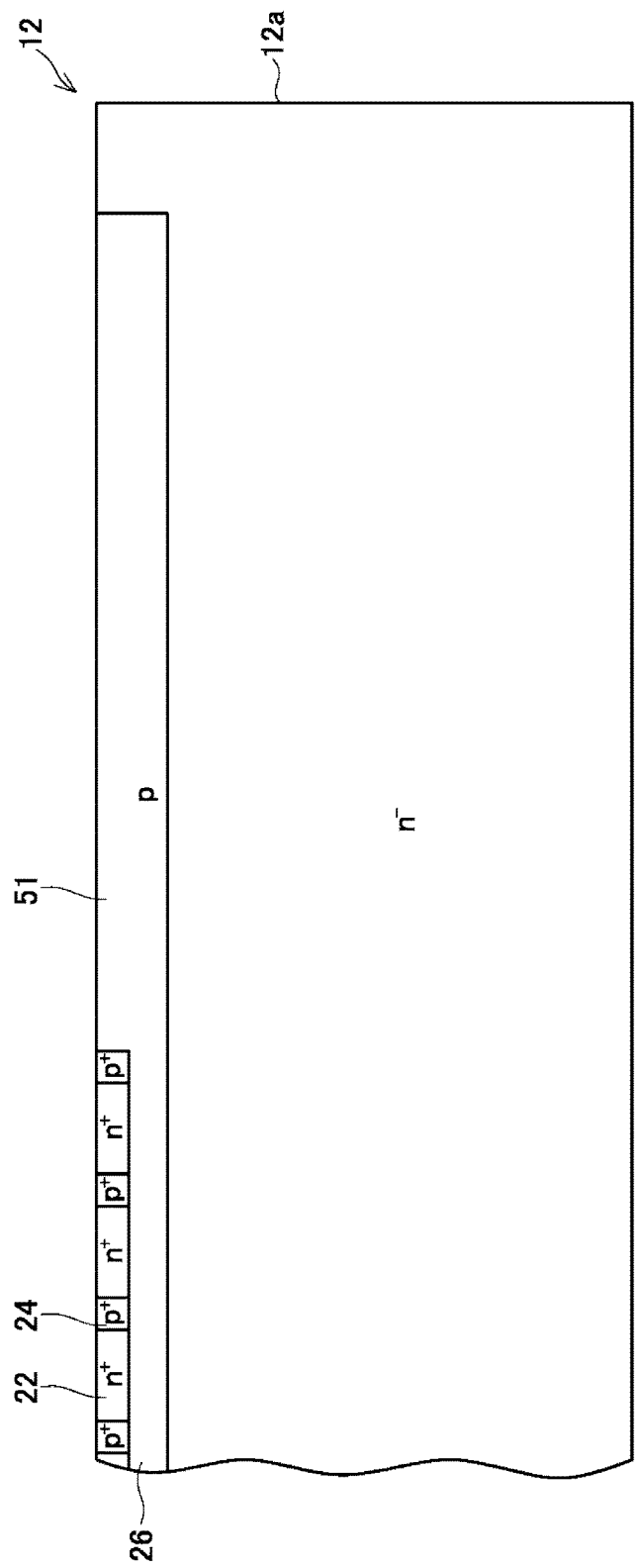
FIG. 6 is a view illustrating a producing process for the semiconductor device 10 of the first embodiment (a vertical sectional view corresponding to FIG. 3).

Next, a producing method for the semiconductor device 10 will be described. First, as shown in FIG. 6, by epitaxial growth, ion implantation, or the like, the source regions 22, the body contact regions 24, the body region 26, and the front surface region 51 are formed in the semiconductor substrate 12.

Figure 7:
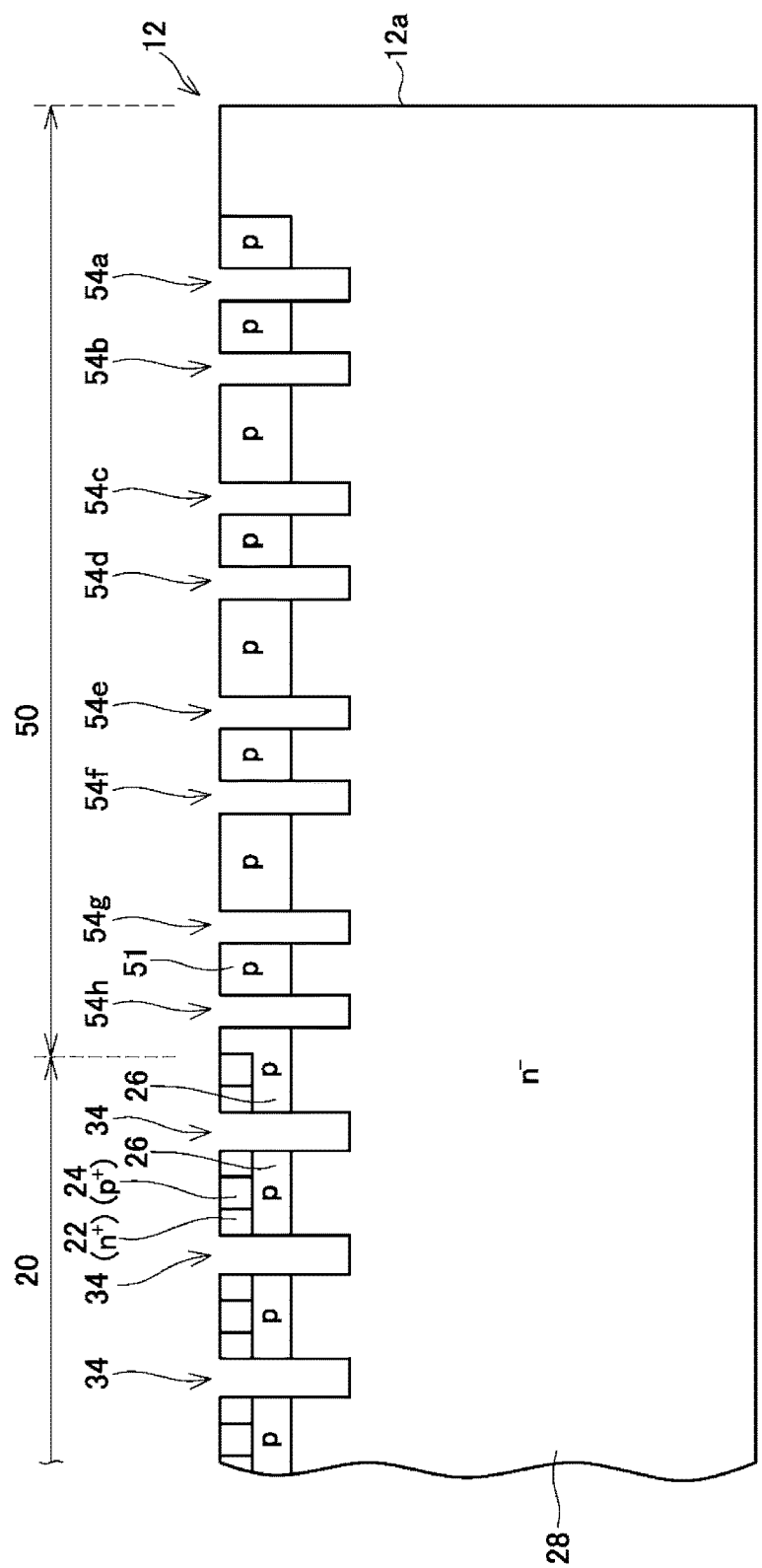
FIG. 7 is a view illustrating the producing process for the semiconductor device 10 of the first embodiment (a vertical sectional view corresponding to FIG. 3).
Figure 8:
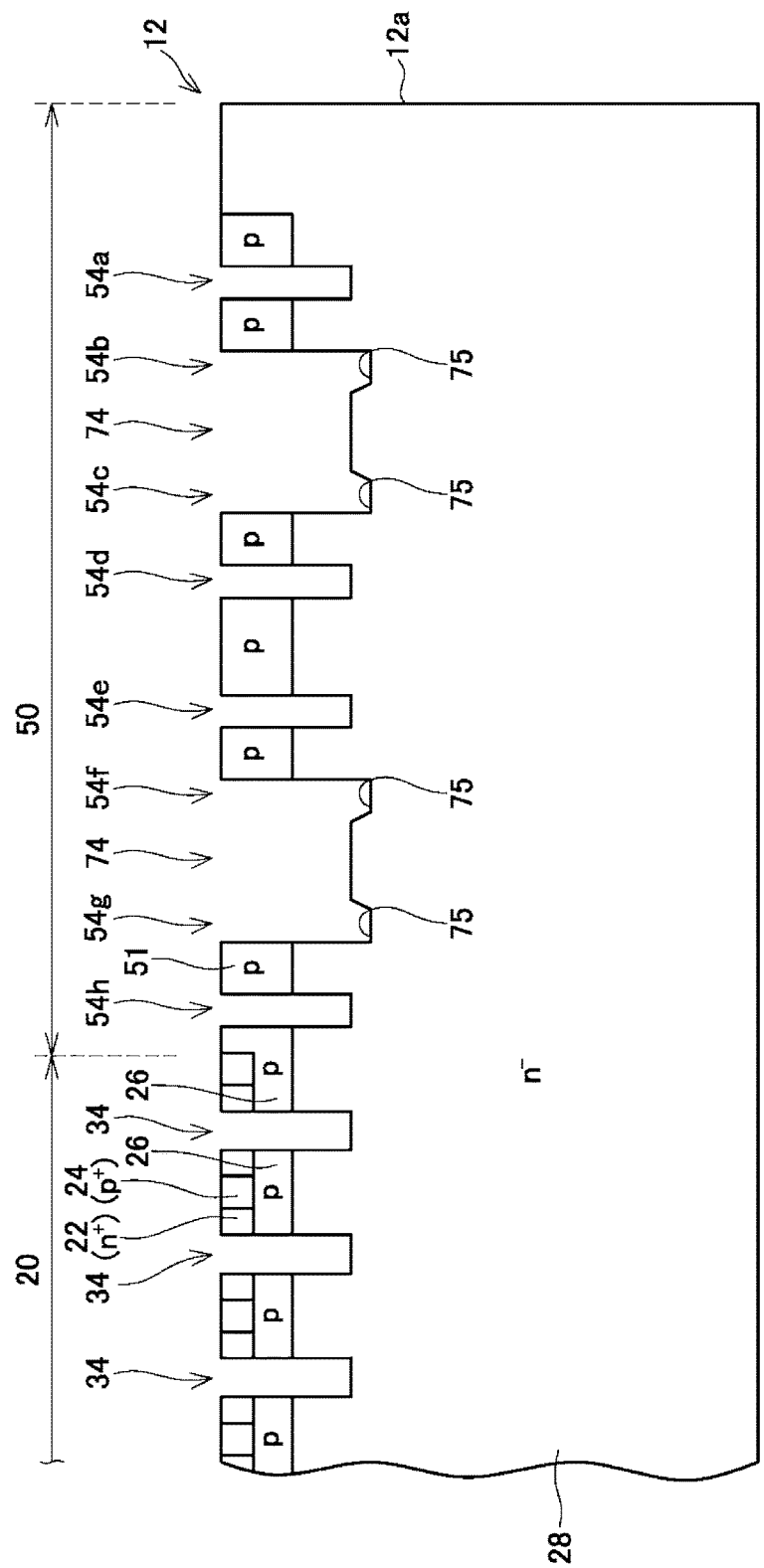
FIG. 8 is a view illustrating the producing process for the semiconductor device 10 of the first embodiment (a vertical sectional view corresponding to FIG. 4).

Next, a mask is formed on the front surface of the semiconductor substrate 12, and thereafter, by anisotropic etching such as RIE, the top surface of the semiconductor substrate 12 is selectively etched. Thus, as shown in FIGS. 7 and 8, the gate trenches 34, the outer periphery trenches 54, and the intervening trenches 74 are simultaneously formed. At this time, since, at the intersection 75 of the outer periphery trench 54 and the intervening trench 74, the substantive trench width is wider than the width of the trenches at the other positions, the feed amount of etching gas to the intersection 75 increases. Therefore, at the intersection 75, the etching rate is higher than at the other positions (so-called microloading effect). Therefore, as shown in FIG. 8, at the intersection 75, the trench depth is greater than at the other positions.

Figure 9:
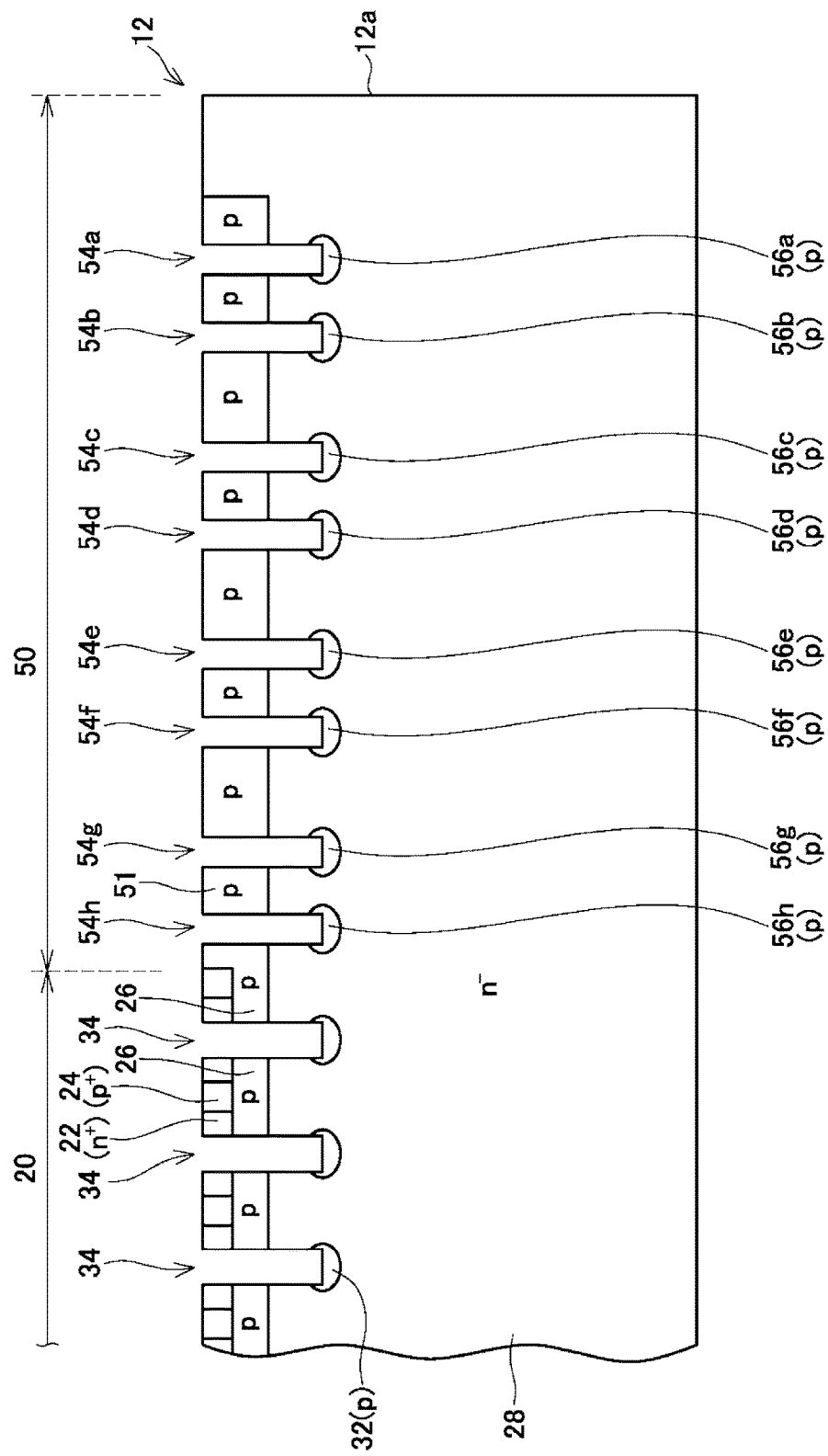
FIG. 9 is a view illustrating the producing process for the semiconductor device 10 of the first embodiment (a vertical sectional view corresponding to FIG. 3).
Figure 10:
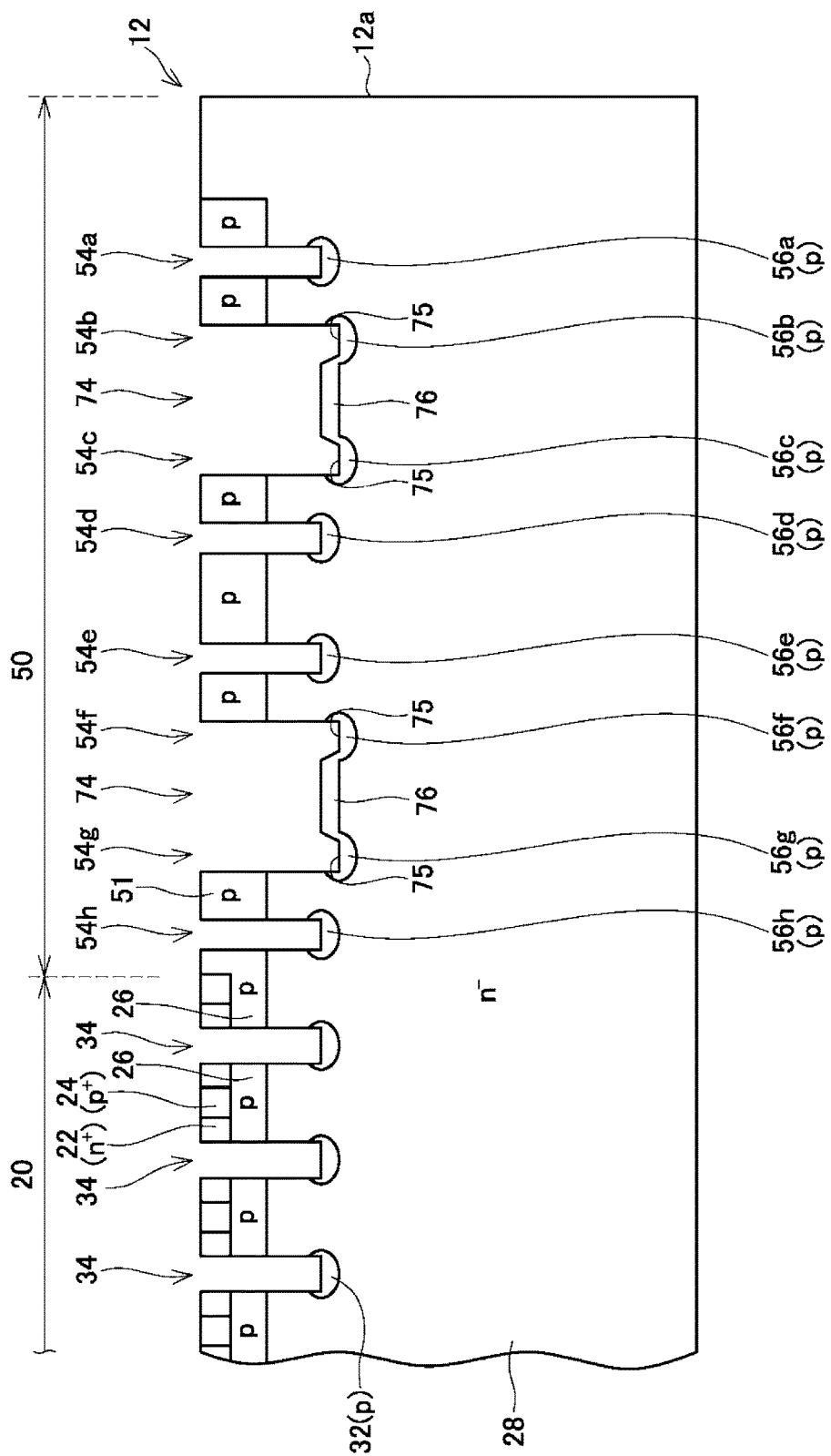
FIG. 10 is a view illustrating the producing process for the semiconductor device 10 of the first embodiment (a vertical sectional view corresponding to FIG. 4).

Next, a mask is formed on the top surface of the semiconductor substrate 12, and thereafter, p-type impurities are ion-implanted in the semiconductor substrate 12. Here, the p-type impurities are implanted in the bottom surfaces of the gate trenches 34, the outer periphery trenches 54, and the intervening trenches 74. Next, the semiconductor substrate 12 is annealed, whereby the implanted p-type impurities are activated. Thus, as shown in FIGS. 9 and 10, the p-type floating regions 32 and the bottom surface regions 56 and 76 are formed. Since the trench is slightly deeper at the intersection 75, the bottom surface region 56 (76) at the intersection 75 is formed at a slightly deeper position than the bottom surface regions 56 and 76 at the other positions.

In the above annealing process, the semiconductor substrate 12 thermally expands. At this time, since the semiconductor substrate 12 expands from its center toward the outer circumference side, displacement due to the thermal expansion being greater on the outer circumference side (that is, end surface 12a side) of the semiconductor substrate 12 than on the center side of the semiconductor substrate 12. If the displacement due to thermal expansion is excessively great, damage such as crack occurs in the partition walls separating the outer periphery trenches 54. However, in the present producing method, since the width W2 of some of the partition walls is great, damage in the partition walls is suppressed. Hereinafter, suppression of damage in the partition walls will be described in more detail.

Figure 11:
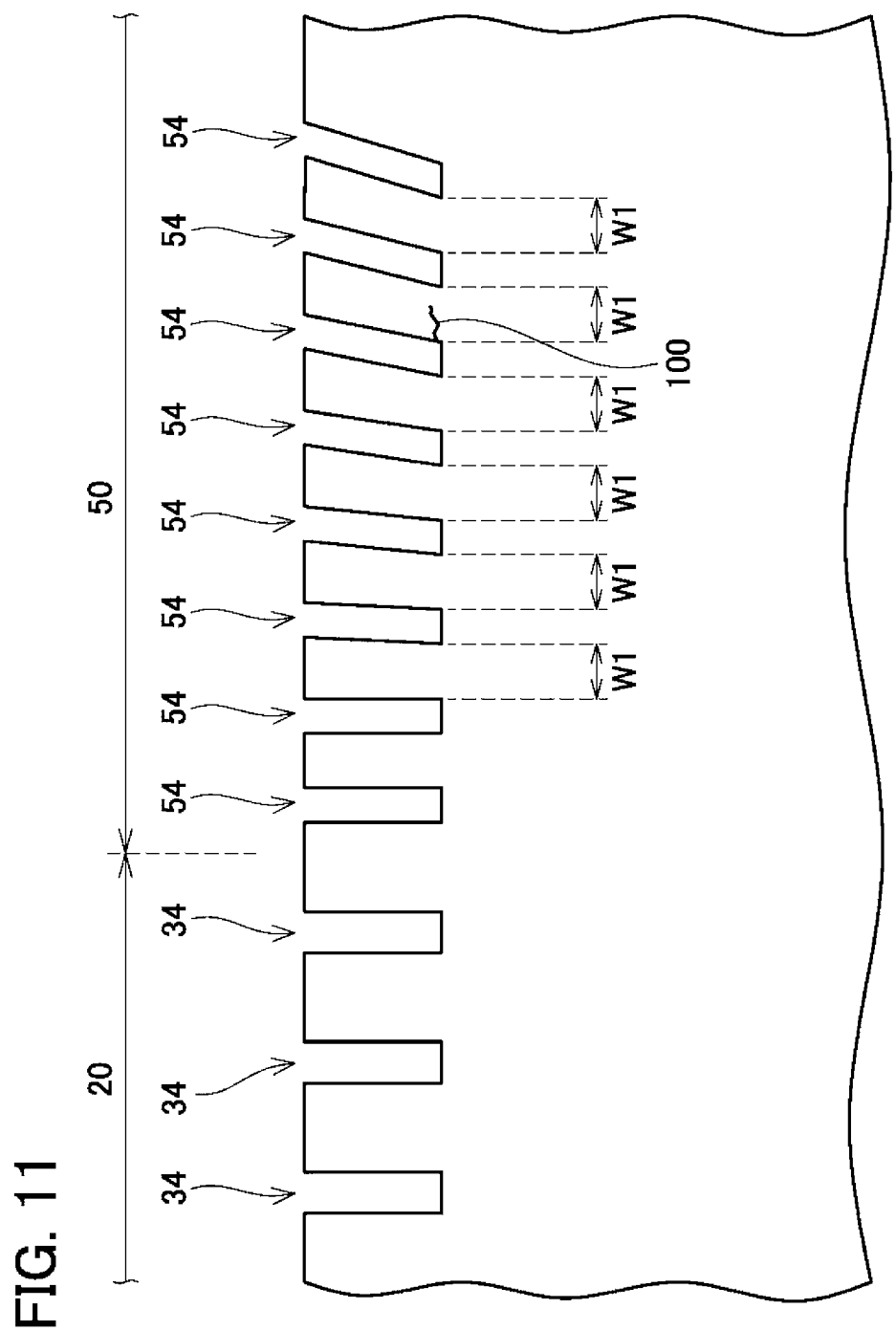
FIG. 11 is a view illustrating damage in partition walls of a semiconductor device of a comparison example.

As a comparison example with respect to the present embodiment, as shown in FIG. 11, it will be assumed that all the partition walls separating the outer periphery trenches 54 have the narrow width W1. In the case where the width of the partition walls is narrow, in the annealing process, the semiconductor substrate is greatly displaced in the outer periphery region 50 as shown in FIG. 11. Since the displacement of the semiconductor substrate is accumulated from the center side toward the outer circumference side, the displacement is greater at a partition wall closer to the outer circumference side. As a result, damage such as crack 100 is likely to occur in a partition wall on the outer circumference side.

On the other hand, in the semiconductor device 10 of the present embodiment, the width W2 of some of the partition walls is great. Since rigidity of the partition walls having the great width W2 is high, displacement due to thermal expansion is suppressed at the partition walls having the width W2. In addition, since the partition walls having the width W2 are unlikely to be displaced, displacement is suppressed also at the partition walls having the width W1, which are adjacent to the partition walls having the width W2. As a result, at all the partition walls, displacement due to thermal expansion is suppressed. Therefore, in the present embodiment, in the annealing process, occurrence of damage in the partition walls is suppressed.

Next, an oxide film is grown on the front surface of the semiconductor substrate 12. Thus, the insulating layers 34a, 53, and 73 are formed in the trenches. Also in growing of the oxide film, stress is applied to the partition walls due to thermal expansion of the semiconductor substrate 12 and growth (volume increase) of the oxide film. In this case, if displacement of each partition wall is great, damage occurs in the partition wall as in the annealing process described above. In addition, in the process of growing the oxide film, if displacement of each partition wall is great, damage such as crack occurs also in the oxide film. In the present embodiment, also in the process of growing the oxide film, owing to the partition walls having the great width W2, displacement of the partition walls is suppressed. Thus, damage in the partition walls and damage in the oxide film are suppressed.

After the insulating layers are formed, next, structures on the top surface side, such as the gate electrode 34c and the front surface electrode 14, are completed. Next, structures on the bottom surface side, such as the drain region 30 and the rear surface electrode 18, are completed. Thus, the semiconductor device 10 is completed.

As described above, in the semiconductor device 10 of the first embodiment, of the outer periphery region 50, in a region where the clearance between the outer periphery trenches 54 is narrow, a depletion layer reaches from the bottom surface region 56 to the adjacent bottom surface region 56. In a region where the clearance between the outer periphery trenches 54 is wide, by the bottom surface region 76 under the intervening trench 74, the bottom surface regions 56 on both sides thereof are connected to each other, so that the depletion layers substantially simultaneously expand around these bottom surface regions 56. This enables the depletion layer to extend over substantially the entirety of the outer periphery region 50. Thus, withstand voltage of the semiconductor device 10 is increased. In addition, since the wide clearance W2 is thus employed for some of the clearances between the outer periphery trenches 54, damage in the partition walls is suppressed in the producing process for the semiconductor device 10. Therefore, in the outer periphery region 50, the partition walls having the narrow width W1 can be formed. Therefore, it becomes possible to produce, with high yield, the semiconductor device 10 that enables broad extension of a depletion layer in the outer periphery region 50.

In the first embodiment described above, the gate trenches 34, the outer periphery trenches 54, and the intervening trenches 74 are simultaneously formed. However, these may not necessarily be formed simultaneously. Some of the outer periphery trenches 54 may be formed first, and then the other outer periphery trenches 54 may be formed.

Second Embodiment

Figure 12:
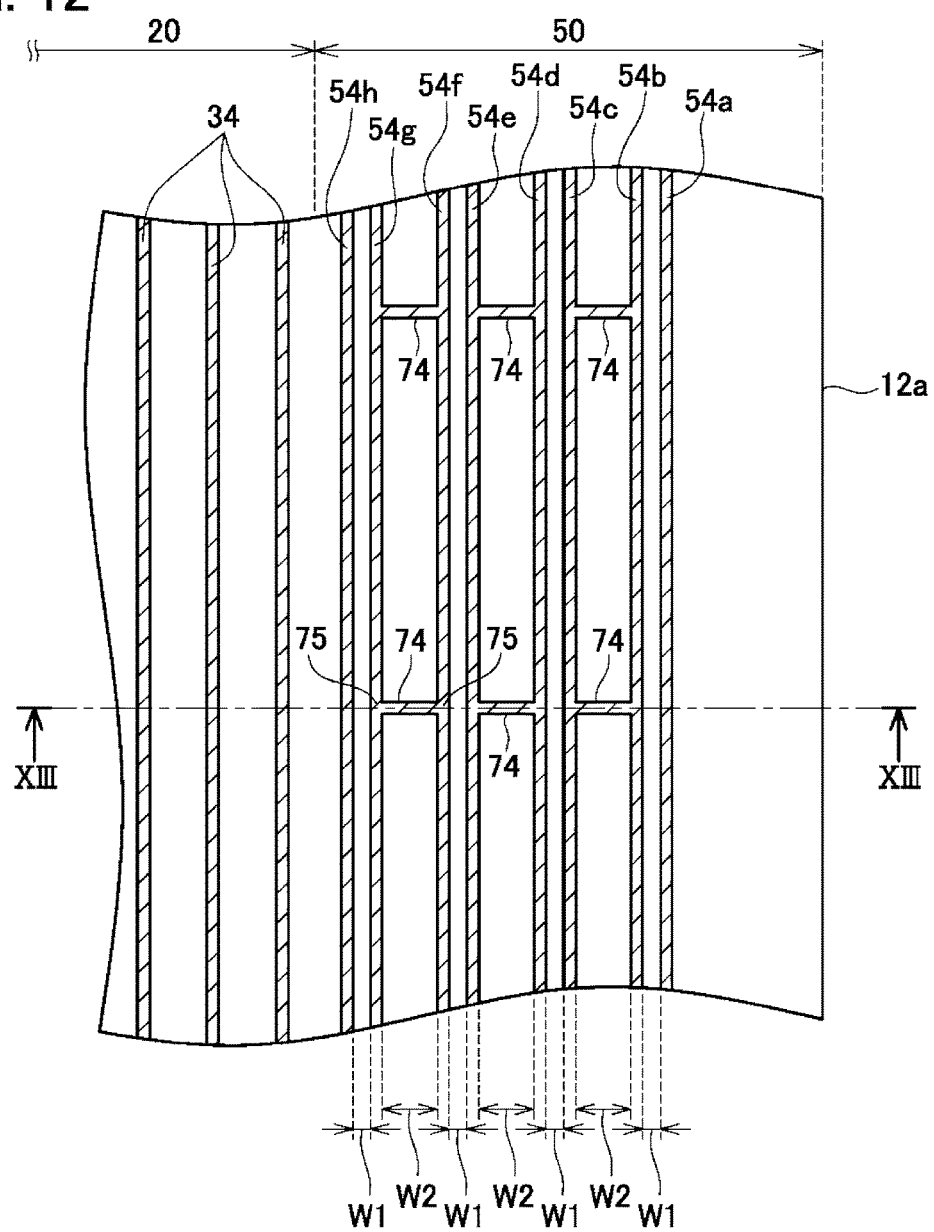
FIG. 12 is an enlarged view of a semiconductor device of the second embodiment, which corresponds to FIG. 2.

In a semiconductor device of the second embodiment, arrangement of the intervening trenches 74 is different from that in the first embodiment, but the other configuration is the same as that in the first embodiment. As shown in FIG. 2, in the first embodiment, the adjacent intervening trenches 74 are arranged in a staggered manner. On the other hand, in the semiconductor device of the second embodiment, as shown in FIG. 12, the adjacent intervening trenches 74 are arranged in straight lines. In other words, each intervening trench 74 extends on an extended line of the adjacent intervening trench 74.

In the case where the intervening trenches 74 are arranged in the staggered manner as in the first embodiment, as shown in FIGS. 4 and 5, the bottom surface region 56 under the intersection 75 protrudes slightly downward relative to the bottom surface region 56 under the adjacent outer periphery trench 54. For example, as shown in FIG. 4, a lower end of the outer periphery trench 54f at the intersection 75 protrudes downward relative to a lower end of the outer periphery trench 54e. Therefore, the bottom surface region 56f under the intersection 75 protrudes slightly downward relative to the bottom surface region 56e under the outer periphery trench 54e. Therefore, there is a possibility that, when the MOSFET is off, an electric field concentrates on the periphery of the bottom surface region 56 under the intersection 75.

Figure 13:
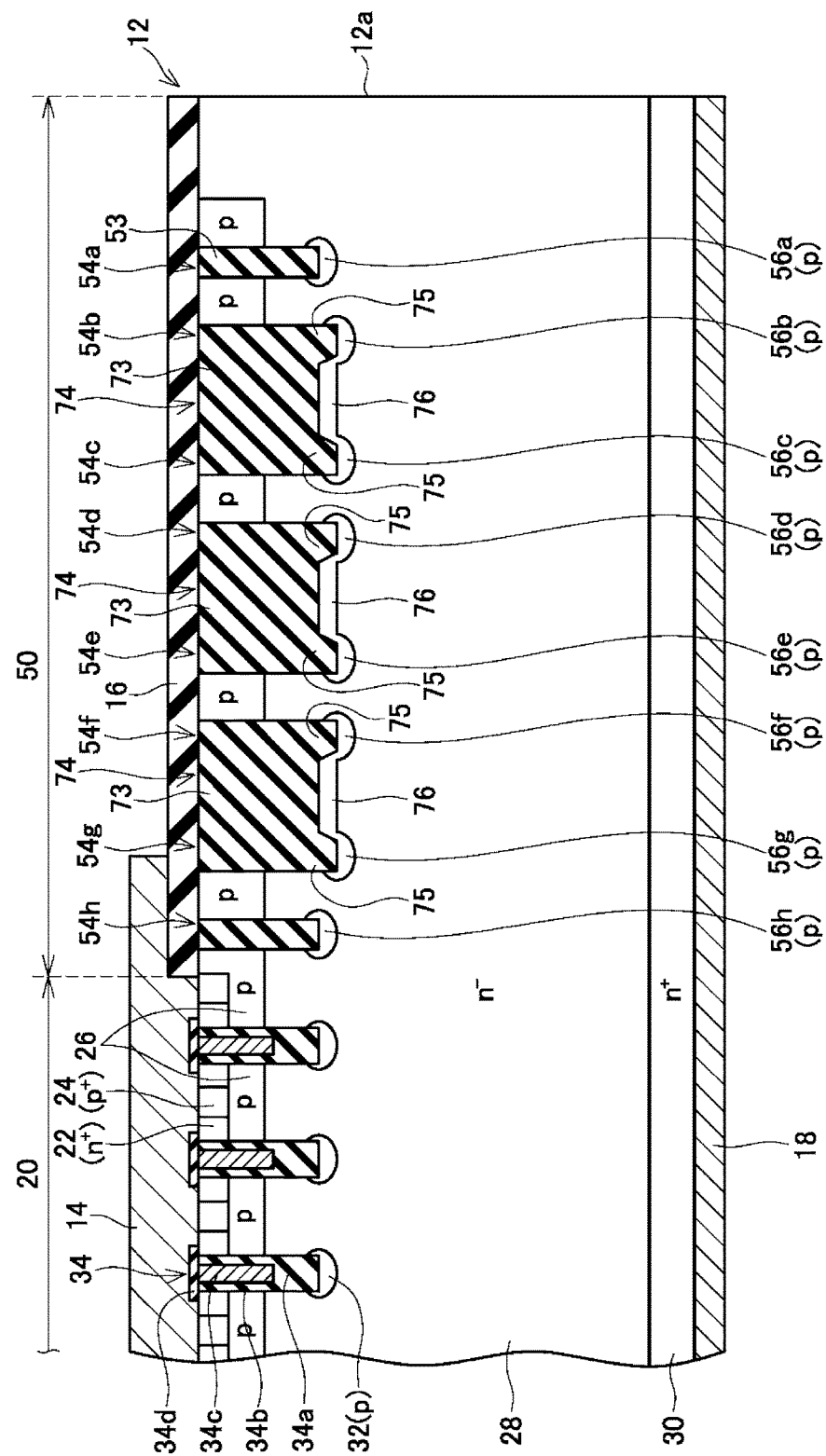
FIG. 13 is a vertical sectional view along XIII-XIII line in FIG. 12.

On the other hand, in the second embodiment, as shown in FIGS. 12 and 13, the two intersections 75 on both sides of the partition wall having the width W1 are adjacent to each other. That is, the bottom surface regions 56 under the intersections 75 are adjacent to each other on both sides of the partition wall having the width W1. For example, the intersection 75 of the outer periphery trench 54f is adjacent to the intersection 75 of the outer periphery trench 54e via the partition wall having the width W1. Therefore, the bottom surface region 56f and the bottom surface region 56e which protrude downward are adjacent to each other via the partition wall having the width W1. As a result, the depths of the bottom surface regions 56 on both sides of the partition wall having the width W1 become substantially equal to each other. This suppresses electric field concentration on the periphery of the bottom surface region 56 under the intersection 75. Further, since two intersections 75 at which electric field concentration is relatively likely to occur are gathered at one location, the number of locations at which electric field concentration is likely to occur can be decreased. This also suppresses electric field concentration in the outer periphery region 50. Therefore, the semiconductor device of the second embodiment has higher withstand voltage.

Third Embodiment

Figure 14:
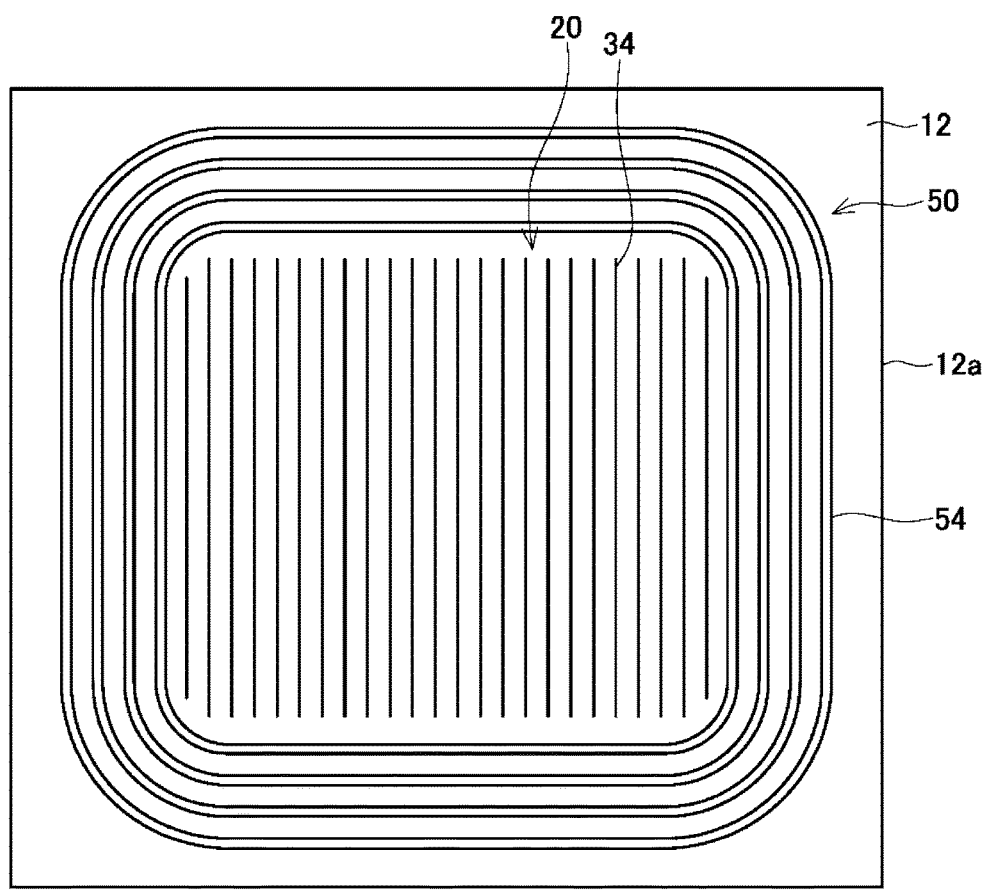
FIG. 14 is a plan view of a semiconductor device of the third embodiment, which corresponds to FIG. 1.
Figure 15:
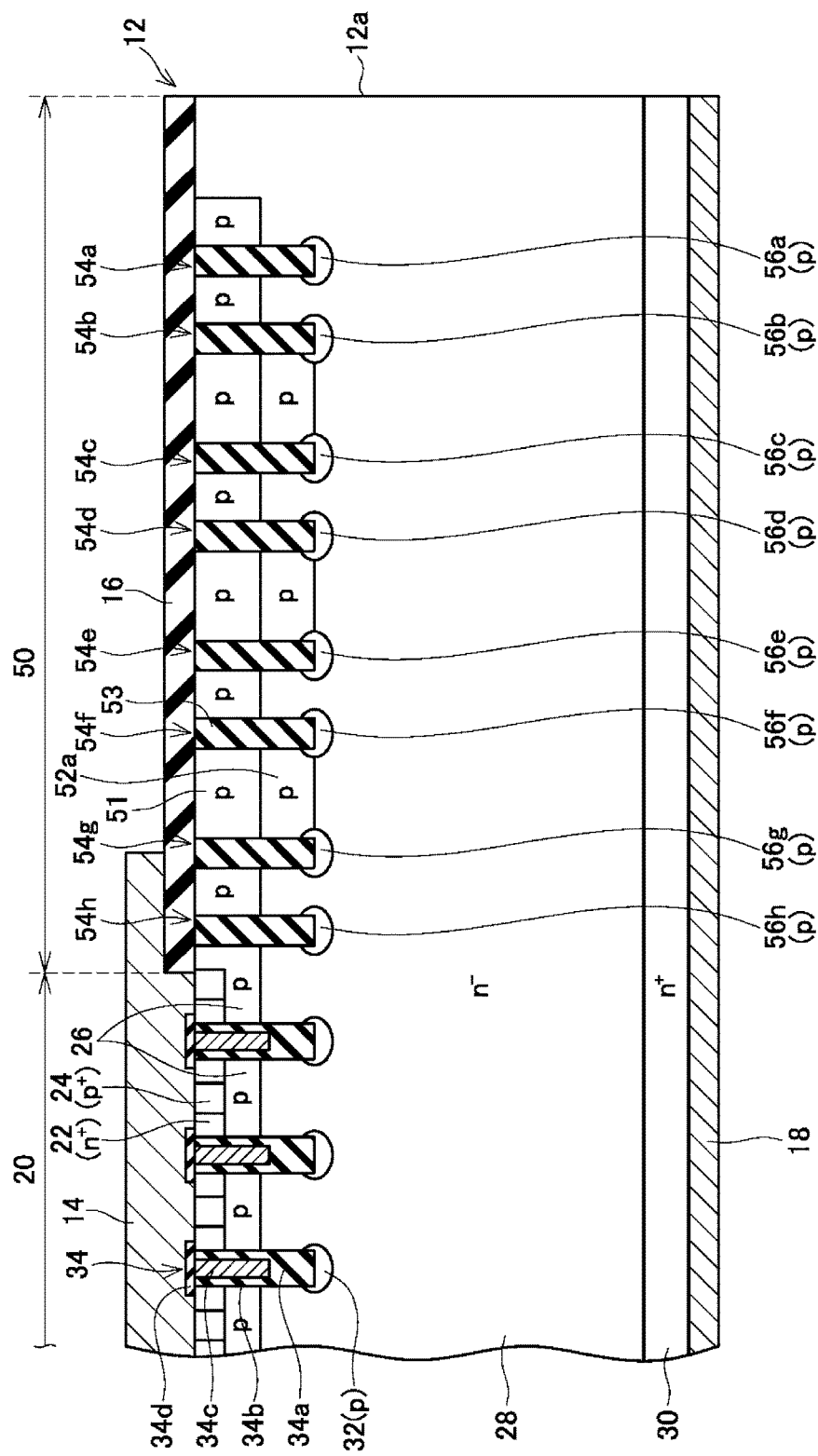
FIG. 15 is a vertical sectional view of the semiconductor device of the third embodiment, which corresponds to FIG. 3.

A semiconductor device of the third embodiment has no intervening trench 74, as shown in FIG. 14. In the semiconductor device of the third embodiment, as shown in FIG. 15, p-type regions 52a are formed under the front surface region 51. The p-type regions 52a are formed in the partition walls having the width W2. Each p-type region 52a is connected to the two bottom surface regions 56 positioned on both sides thereof. That is, in the semiconductor device of the third embodiment, the two bottom surface regions 56 on both sides of each partition wall having the width W2 are connected to each other by, instead of the bottom surface region 76 under the intervening trench 74, the p-type region 52a expanding from the front surface of the semiconductor substrate 12 to a deep position. Even by such a configuration in which the bottom surface regions 56 are connected to each other by each p-type region 52a, a depletion layer can be extended in the outer periphery region 50, as in the first embodiment.

Fourth Embodiment

Figure 16:
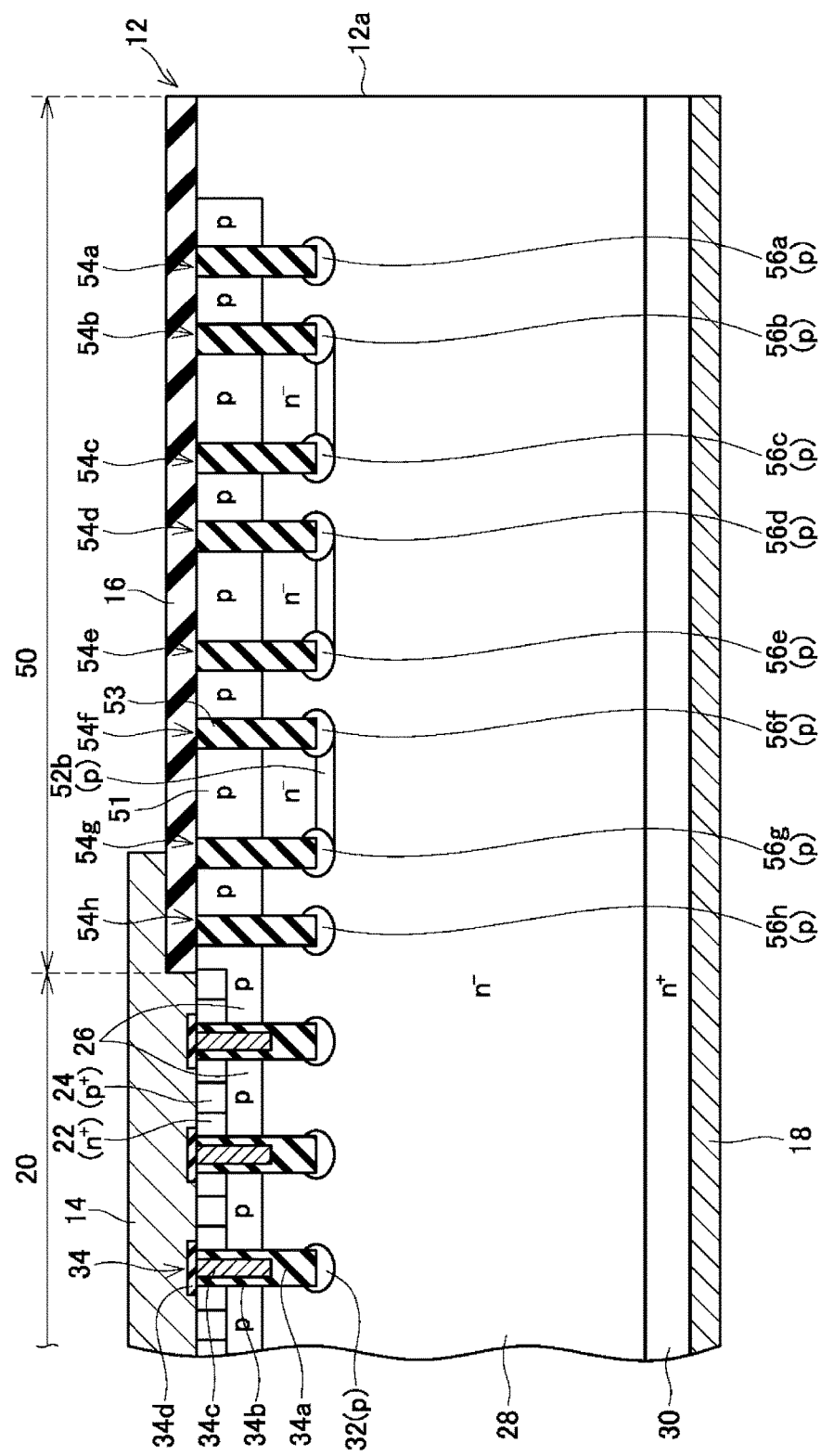
FIG. 16 is a vertical sectional view of a semiconductor device of the fourth embodiment, which corresponds to FIG. 3.

A semiconductor device of the fourth embodiment has no intervening trench 74, as in the semiconductor device of the third embodiment. In the semiconductor device of the fourth embodiment, as shown in FIG. 16, p-type regions 52b are formed at the same depth as the bottom surface regions 56. The p-type regions 52b are formed in the partition walls having the width W2. The drift region 28 is formed above the p-type regions 52b. The p-type regions 52b are separated from the front surface region 51 by the drift region 28. Each p-type region 52b is connected to the two bottom surface regions 56 positioned on both sides thereof. That is, in the semiconductor device of the fourth embodiment, the two bottom surface regions 56 positioned on both sides of each partition wall having the width W2 are connected to each other by the p-type region 52b formed at the same depth as the bottom surface region 56. Even by such a configuration in which the bottom surface regions 56 are connected to each other by each p-type region 52b, a depletion layer can be extended in the outer periphery region 50, as in the first embodiment.

The p-type region 52a or 52b in the third or fourth embodiment described above may be formed over the entirety of each partition wall having the width W2, in a plan view of the top surface of the semiconductor substrate 12. Alternatively, as in the intervening trench 74 shown in FIG. 2, the p-type region 52a or 52b may be formed only in part of each partition wall having the width W2, in a plan view of the top surface of the semiconductor substrate 12.

Fifth Embodiment

Figure 17:
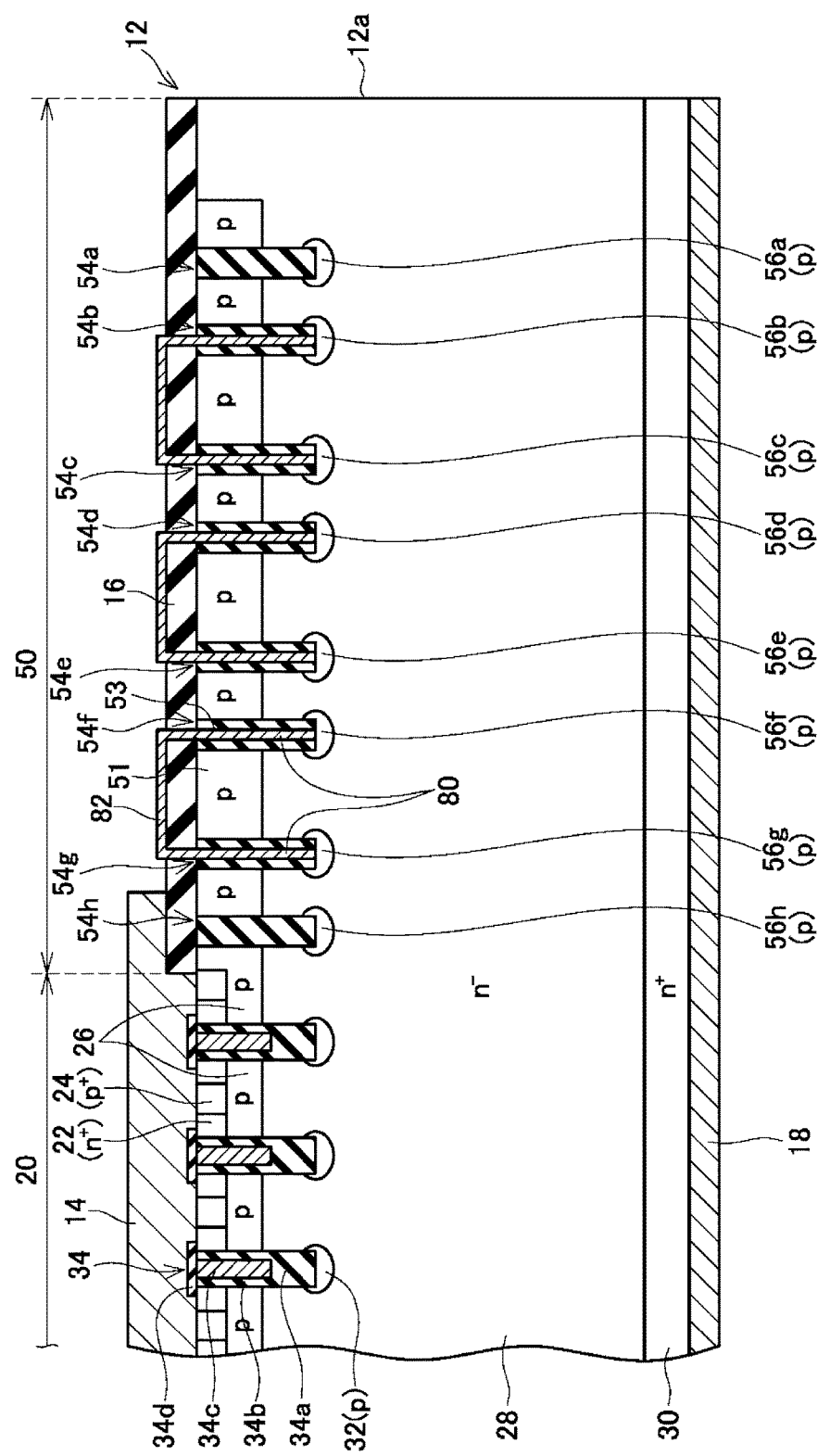
FIG. 17 is a vertical sectional view of a semiconductor device of the fifth embodiment, which corresponds to FIG. 3.

A semiconductor device of the fifth embodiment has no intervening trench 74, as in the semiconductor device of the third embodiment. In the semiconductor device of the fifth embodiment, as shown in FIG. 17, a wiring 80 is formed in each outer periphery trench 54. The wiring 80 is made of metal or another conductor. An insulating layer 53 is formed between the wiring 80 and a side surface of the outer periphery trench 54. The wiring 80 extends to a lower end of the outer periphery trench 54, to have contact with the bottom surface region 56. The wiring 80 extends to an upper end of the outer periphery trench 54, to be connected to a wiring 82 provided on the front surface of the semiconductor substrate 12. The wiring 82 connects the wirings 80 in the two outer periphery trenches 54 on both sides of each partition wall having the width W2. The two bottom surface regions 56 on both sides of each partition wall having the width W2 are connected to each other by the wirings 80 and 82. Even by such a configuration in which the two bottom surface regions 56 on both sides of each partition wall having the width W2 are connected to each other by a conductor, a depletion layer can be extended in the outer periphery region 50, as in the first embodiment.

As described above, in the semiconductor devices of the first to fifth embodiments, the bottom surface regions on both sides of each partition wall having the width W2 are connected to each other by the p-type region 76 or the conductive layer 82, and the bottom surface regions on both sides of each partition wall having the width W1 are separated from each other by the n-type drift region 28. Therefore, these semiconductor devices have high withstand voltage, and in producing these semiconductor devices, the partition walls are unlikely to be damaged.

Figure 18:
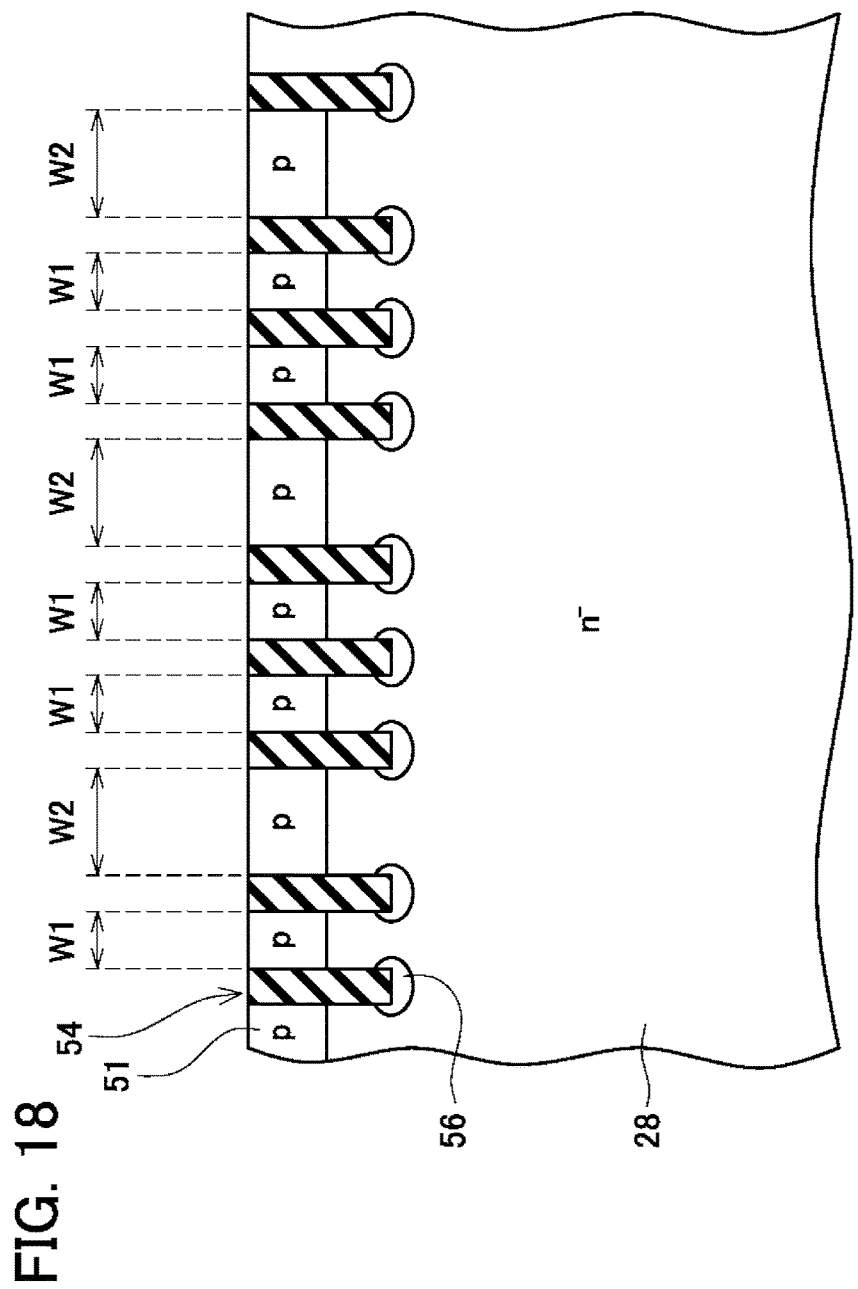
FIG. 18 is a vertical sectional view showing arrangement of outer periphery trenches 54 of a modification.
Figure 19:
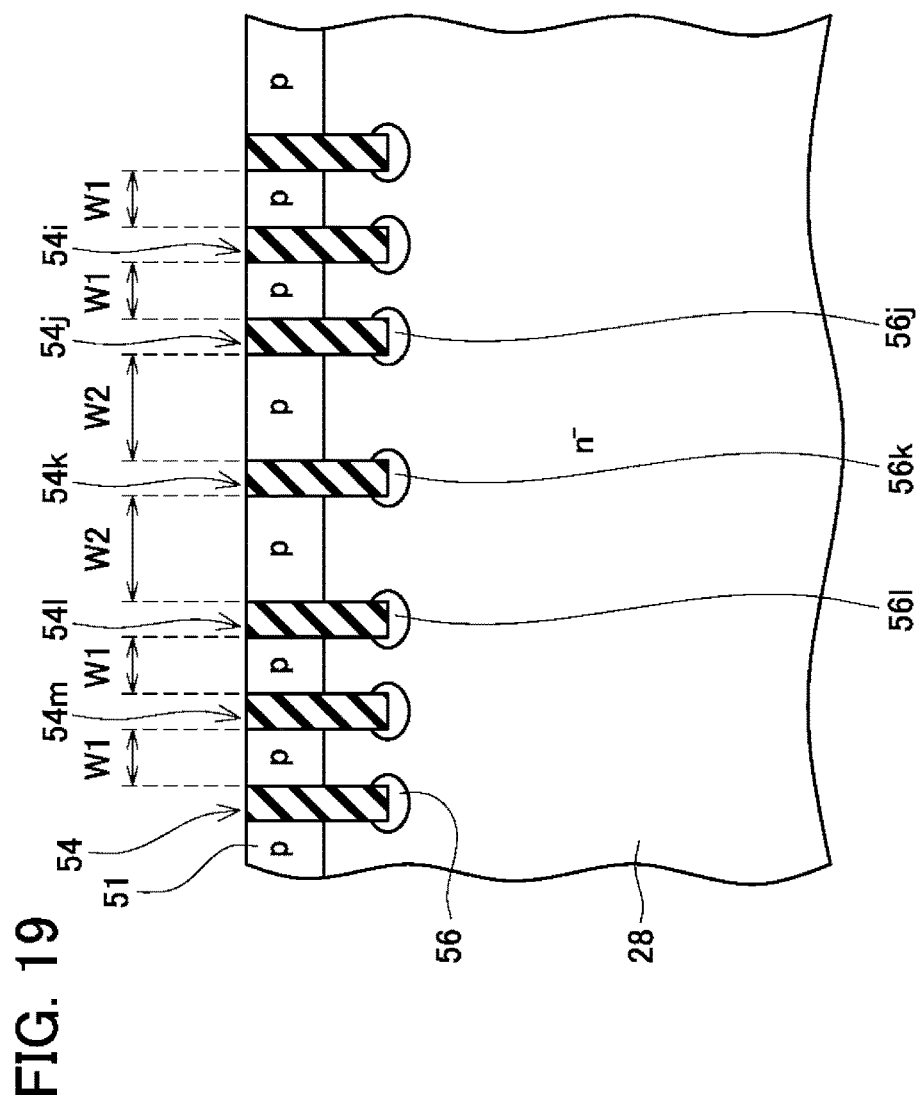
FIG. 19 is a vertical sectional view showing arrangement of outer periphery trenches 54 of another modification.

In the first to fifth embodiments described above, the partition wall having the width W1 and the partition wall having the width W2 are alternately arranged. However, in the first to fifth embodiments described above, arrangement of the partition walls may be modified. For example, as shown in FIG. 18, a plurality of partition walls having the width W1 may be consecutively arranged between the partition walls having the width W2. Even if a predetermined number of partition walls having the width W1 are consecutively arranged between the partition walls having the width W2 as described above, displacement in the producing process can be suppressed by the partition walls having the width W2. In addition, since the number of the partition walls having the width W2 decreases as shown in FIG. 18, the semiconductor device can be downsized. Alternatively, as shown in FIG. 19, a plurality of partition walls having the width W2 may be consecutively arranged. Alternatively, in addition to the clearances W1 and W2, a part where the outer periphery trenches 54 are formed via a clearance different from the clearances W1 and W2, may be provided.

In the first to fifth embodiments described above, the outer periphery trench 54a may be regarded as the first outer periphery trench in claims. In this case, the outer periphery trenches 54b, 54c, and 54d correspond to the second outer periphery trench, the third outer periphery trench, and the fourth outer periphery trench in claims. In the first to fifth embodiments described above, the outer periphery trench 54c may be regarded as the first outer periphery trench in claims. In this case, the outer periphery trenches 54d, 54e, and 54f correspond to the second outer periphery trench, the third outer periphery trench, and the fourth outer periphery trench in claims. In the first to fifth embodiments described above, the outer periphery trench 54e may be regarded as the first outer periphery trench in claims. In this case, the outer periphery trenches 54f, 54g, and 54h correspond to the second outer periphery trench, the third outer periphery trench, and the fourth outer periphery trench in claims. In the example in FIG. 19, an outer periphery trench 54i corresponds to the first outer periphery trench in claims, an outer periphery trench 54j corresponds to the second outer periphery trench in claims, an outer periphery trench 54l corresponds to the third outer periphery trench in claims, and an outer periphery trench 54m corresponds to the fourth outer periphery trench in claims. In the example in FIG. 19, a bottom surface region 56j under the outer periphery trench 54j and a bottom surface region 56k under an outer periphery trench 54k are connected to each other by a p-type region and/or metal, and the bottom surface region 56k and a bottom surface region 56l under the outer periphery trench 54l are connected to each other by a p-type region and/or metal. Therefore, the bottom surface region 56j and the bottom surface region 56l are connected to each other by a p-type region and/or metal. Therefore, the outer periphery trench 54j may be regarded as the second outer periphery trench in claims, and the outer periphery trench 54l may be regarded as the third outer periphery trench in claims.

In the above embodiments, a semiconductor substrate made of SiC is used, but another semiconductor substrate may be used. However, since a semiconductor substrate made of SiC is brittle and easy to crack, it is especially effective to suppress damage in partition walls by the technique disclosed herein.

In the above embodiments, a producing method for MOSFET is described, but the above-described technique may be applied to a producing process for another insulated gate type semiconductor device such as IGBT.

In the above embodiments, the p-type floating region 32 is formed at a lower end of the gate trench 34, but instead of the p-type floating region 32, a p-type region connected to a predetermined potential may be formed.

In the above embodiments, the outer periphery trench 54 is formed in an annular shape circulating around the cell region 20, but the outer periphery trench 54 may not necessarily have such an annular shape. For example, the outer periphery trench 54 may be formed only at a part of the outer periphery region 50, where a problem of withstand voltage arises.

In the above embodiments, the outer periphery trench 54 is formed between the cell region 20 and the end surface 12a of the semiconductor substrate 12, but the outer periphery trench 54 may be formed at another location. For example, the outer periphery trench 54 may be formed between two cell regions 20.

In the above embodiments, the insulating layer in each trench is formed by an oxide film, but these insulating layers may be formed by another insulating layer such as a nitride film.

The embodiments have been described in detail in the above. However, these are only examples and do not limit the claims. The technology described in the claims includes various modifications and changes of the concrete examples represented above.

The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. An insulated gate type semiconductor device, comprising:
   a semiconductor substrate;
   a front surface electrode formed on a front surface of the semiconductor substrate; and
   a rear surface electrode formed on a rear surface of the semiconductor substrate;
   wherein
   the insulated gate type semiconductor device is configured to switch current between the front surface electrode and the rear surface electrode,
   the insulated gate type semiconductor device further comprises:
   a first semiconductor region being of a first conductive type and connected to the front surface electrode;
   a second semiconductor region being of a second conductive type and in contact with the first semiconductor region;
   a third semiconductor region being of the first conductive type and separated from the first semiconductor region by the second semiconductor region;

a plurality of gate trenches formed in the front surface of the semiconductor substrate and penetrating the second semiconductor region to reach the third semiconductor region;

gate insulating films and gate electrodes located in the gate trenches;

fourth semiconductor regions being of the second conductive type and formed in ranges exposed to bottom surfaces of the gate trenches;

a plurality of outer periphery trenches formed in the front surface of the semiconductor substrate in a range outside the second semiconductor region, the plurality of outer periphery trenches including:

a first outer periphery trench, a second outer periphery trench adjacent to the first outer periphery trench on the second semiconductor region side, a third outer periphery trench located on the second semiconductor region side with respect to the second outer periphery trench, and a fourth outer periphery trench adjacent to the third outer periphery trench on the second semiconductor region side, insulating layers located in the outer periphery trenches;

fifth semiconductor regions being of the second conductive type and formed in ranges exposed to bottom surfaces of the outer periphery trenches; and a connection region made of a conductive layer or a second conductive type semiconductor region and connecting the fifth semiconductor region exposed to the bottom surface of the second outer periphery trench to the fifth semiconductor region exposed to the bottom surface of the third outer periphery trench, wherein a clearance between the second outer periphery trench and the third outer periphery trench is wider than each of a clearance between the first outer periphery trench and the second outer periphery trench and a clearance between the third outer periphery trench and the fourth outer periphery trench.

2. An insulated gate type semiconductor device of claim 1, further comprising:

a first intervening trench formed between the second outer periphery trench and the third outer periphery trench and extending from the second outer periphery trench side to the third outer periphery trench side; and an insulating layer located in the first intervening trench, wherein the connection region is made of a sixth semiconductor region formed in a range exposed to a bottom surface of the first intervening trench, connected to the fifth semiconductor region exposed to the bottom surface of the second outer periphery trench, and connected to the fifth semiconductor region exposed to the bottom surface of the third outer periphery trench.

3. An insulated gate type semiconductor device of claim 2, wherein the first intervening trench is connected to the second outer periphery trench and is connected to the third outer periphery trench.

4. An insulated gate type semiconductor device of claim 3, wherein the plurality of outer periphery trenches further comprises the fifth outer periphery trench located on the second semiconductor region side with respect to the fourth outer periphery trench, a clearance between the fourth outer periphery trench and the fifth outer periphery trench is wider than each of the clearance between the first outer periphery trench and the second outer periphery trench and the clearance between the third outer periphery trench and the fourth outer periphery trench, the insulated gate type semiconductor device further comprises:

a second intervening trench formed between the fourth outer periphery trench and the fifth outer periphery trench, extending from the fourth outer periphery trench side to the fifth outer periphery trench side, connected to the fourth outer periphery trench, and connected to the fifth outer periphery trench;

an insulating layer located in the second intervening trench; and a seventh semiconductor region being of the second conductive type, formed in a range exposed to a bottom surface of the second intervening trench, connected to the fifth semiconductor region exposed to the bottom surface of the fourth outer periphery trench, and connected to the fifth semiconductor region exposed to the bottom surface of the fifth outer periphery trench, and the second intervening trench is configured to extend on an extended line of the first intervening trench.

* * * * *